US011962105B2

(12) United States Patent
Hata et al.

(10) Patent No.: US 11,962,105 B2
(45) Date of Patent: Apr. 16, 2024

(54) COUPLING METHOD AND ROBOT SYSTEM

(71) Applicant: SEIKO EPSON CORPORATION, Tokyo (JP)

(72) Inventors: Hideki Hata, Chino (JP); Masaki Miyasaka, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 612 days.

(21) Appl. No.: 17/160,425

(22) Filed: Jan. 28, 2021

(65) Prior Publication Data

US 2021/0257762 A1    Aug. 19, 2021

(30) Foreign Application Priority Data

Jan. 30, 2020 (JP) ................................ 2020-013347

(51) Int. Cl.
| | | |
|---|---|---|
| *H01R 43/00* | (2006.01) | |
| *H01R 12/77* | (2011.01) | |
| *H02K 5/22* | (2006.01) | |
| *H05K 13/00* | (2006.01) | |

(52) U.S. Cl.
CPC ........... *H01R 12/774* (2013.01); *H02K 5/225* (2013.01); *H01R 2201/10* (2013.01)

(58) Field of Classification Search
CPC ...... H02K 5/225; H01R 43/26; H01R 12/774; H01R 12/79; H01R 2201/10; H05K 3/365; H05K 1/147; H05K 2201/10189
See application file for complete search history.

(56) References Cited

U.S. PATENT DOCUMENTS

| | | | | |
|---|---|---|---|---|
| 11,267,123 | B2 * | 3/2022 | Ueda | ...................... B25J 9/1015 |
| 11,413,765 | B2 * | 8/2022 | Takeyama | ............... B23P 19/04 |
| 2020/0376679 | A1 | 12/2020 | Takeyama et al. | |

FOREIGN PATENT DOCUMENTS

| | | |
|---|---|---|
| CN | 110461552 A | 11/2019 |
| JP | 2017224527 A | 12/2017 |
| JP | 2019029190 A | 2/2019 |

OTHER PUBLICATIONS

Search Report of the First Office Action CN Application No. 2021101110507 dated Apr. 13, 2023.

\* cited by examiner

*Primary Examiner* — Paul D Kim
(74) *Attorney, Agent, or Firm* — Samson G. Yu

(57) ABSTRACT

A coupling method of coupling a flexible flat cable to a connector by a robot, includes a preparation step of preparing the connector having an insertion hole into which the flat cable is inserted and a seat having an introduction surface placed at a front side of the insertion hole and continuously coupled to the insertion hole, a first moving step of gripping the flat cable and moving the flat cable to a position facing the seat; and a pressing step of bringing the flat cable into contact with the introduction surface in a posture inclined relative to the seat with an end of the flat cable facing the insertion hole side and pressing the flat cable against the introduction surface, and moving the end toward the connector side.

7 Claims, 18 Drawing Sheets

COUPLING METHOD AND ROBOT SYSTEM

The present application is based on, and claims priority from JP Application Serial Number 2020-013347, filed Jan. 30, 2020, the disclosure of which is hereby incorporated by reference herein in its entirety.

BACKGROUND

1. Technical Field

The present disclosure relates to a coupling method and a robot system.

2. Related Art

For example, JP-A-2017-224527 discloses a single-arm robot including a base and an arm pivotable relative to the base. Further, a gripping mechanism that grips an FFC (Flexible Flat Cable) is attached to an arm distal end portion of the robot. According to the robot, the arm is moved in an attachment state with the FFC gripped by the gripping mechanism, and thereby, a coupling work of inserting and coupling the FFC into a connector may be performed. In the FFC coupling method described in JP-A-2017-224527, even when the connector to which the FFC is coupled is a ZIF connector, the coupling work may be preferably performed.

Note that the ZIF connector is a connector that may prevent damage on pins by application of an excessive force and a contact failure due to loose fit. The ZIF connector in JP-A-2017-224527 has a connector main body and a lid pivotably coupled to the connector main body. The lid is opened when the FFC is coupled and the lid is closed after the coupling of the FFC is completed, and thereby, the FFC may be sandwiched and fixed between the connector main body and the lid.

However, the FFC coupling method described in JP-A-2017-224527 has a problem that it is difficult to preferably perform the coupling work when a NON-ZIF connector is used.

SUMMARY

A coupling method according to an aspect of the present disclosure is a coupling method of coupling a flexible flat cable to a connector by a robot, includes a preparation step of preparing the connector having an insertion hole into which the flat cable is inserted and a seat having an introduction surface placed at a front side of the insertion hole and continuously coupled to the insertion hole, a first moving step of gripping the flat cable and moving the flat cable to a position facing the seat, and a pressing step of bringing the flat cable into contact with the introduction surface in a posture inclined relative to the seat with an end of the flat cable facing the insertion hole side and pressing the flat cable against the introduction surface, and moving the end toward the connector side.

A robot system according to an aspect of the present disclosure is a robot system that performs a work of coupling a flexible flat cable to a connector, including a robot that grips the flat cable, and a robot control apparatus that controls the robot, wherein the connector has an insertion hole into which the flat cable is inserted, a seat having an introduction surface continuously coupled to the insertion hole is placed at a front side of the insertion hole, and the robot control apparatus controls the robot to perform a first moving operation of gripping the flat cable and moving the flat cable to a position facing the seat, and a pressing operation of bringing the flat cable into contact with the introduction surface in a posture inclined relative to the seat with an end of the flat cable facing the insertion hole side and further pressing the flat cable against the introduction surface, and moving the end toward the connector side.

DESCRIPTION OF EXEMPLARY EMBODIMENTS

As below, a coupling method and a robot system according to the present disclosure will be explained in detail according to preferred embodiments shown in the accompanying drawings.

First Embodiment

Figure 1:
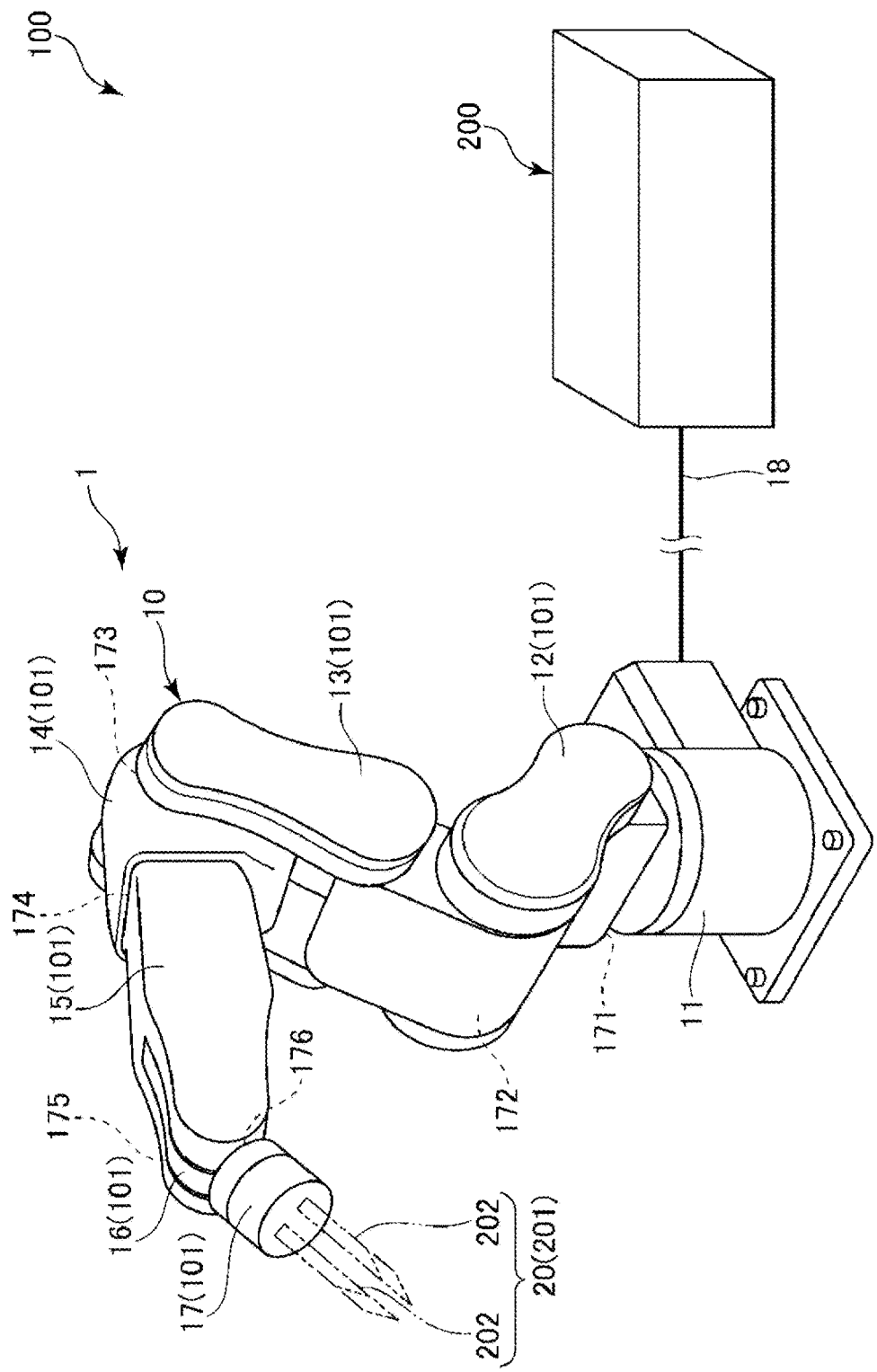
FIG. 1 is an overall configuration diagram showing a robot system according to a first embodiment.
Figure 2:
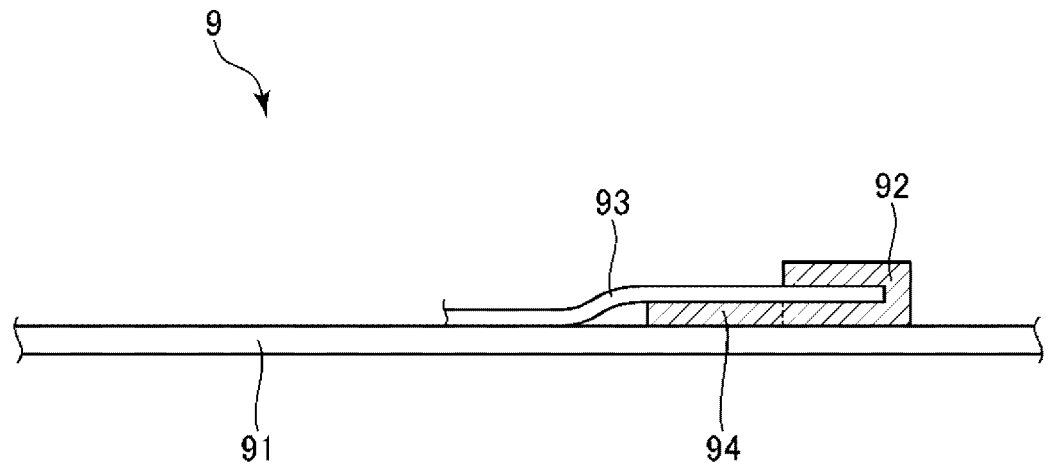
FIG. 2 is a sectional view showing an electronic component assembly assembled by the robot system in FIG. 1.
Figure 3:
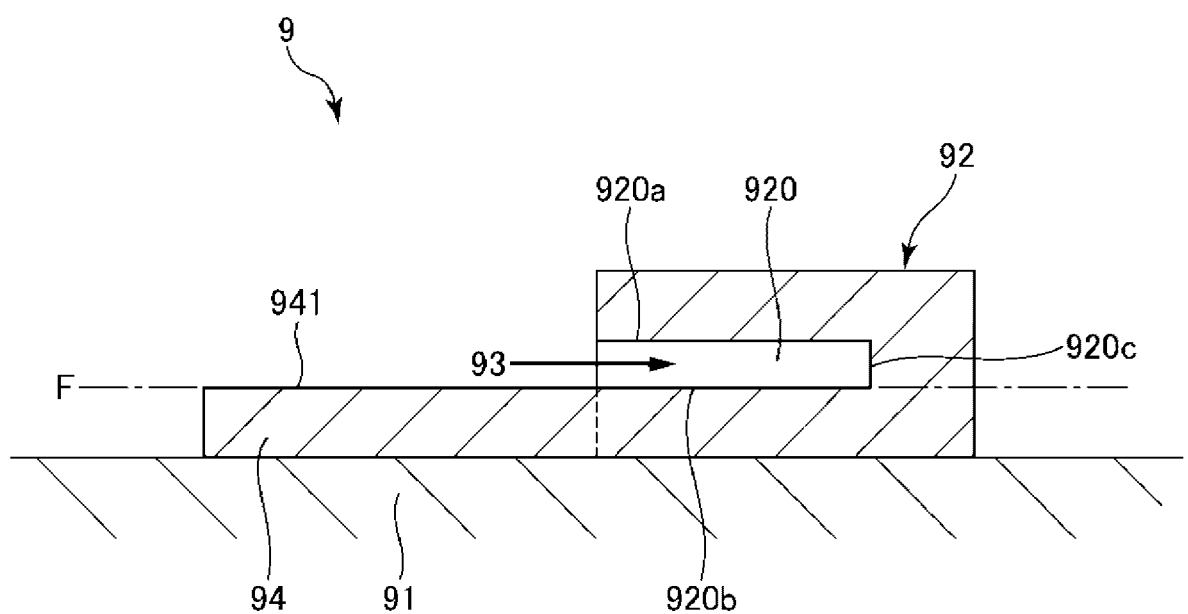
FIG. 3 is a sectional view showing a connector and a seat of the electronic component assembly shown in FIG. 2.
Figure 4:
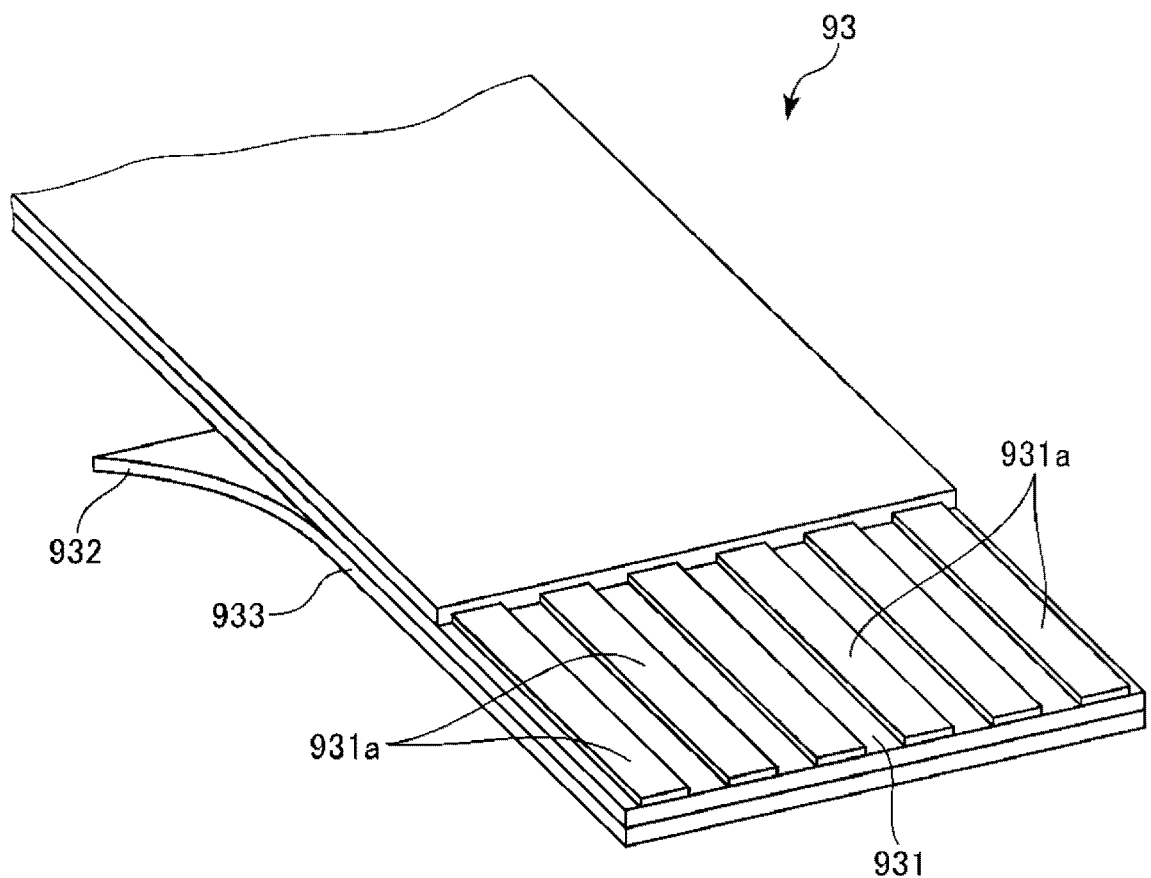
FIG. 4 is a perspective view showing a flat cable of the electronic component assembly shown in FIG. 2.
Figure 5:
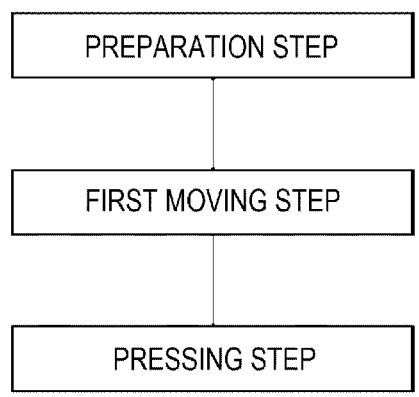
FIG. 5 is a process chart showing a coupling method of coupling the flat cable to the connector.

FIG. 1 is an overall configuration diagram showing a robot system according to a first embodiment. FIG. 2 is a sectional view showing an electronic component assembly assembled by the robot system in FIG. 1. FIG. 3 is a sectional view showing a connector and a seat of the electronic component assembly shown in FIG. 2. FIG. 4 is a perspective view showing a flat cable of the electronic component assembly shown in FIG. 2. FIG. 5 is a process chart showing a coupling method of coupling the flat cable to the connector. FIGS. 6 to 10 are respectively sectional views showing the coupling method of coupling the flat cable to the connector.

Note that, hereinafter, for convenience of explanation, the upsides in FIGS. 1 to 4, 6 to 10, 12 to 16, and 18 to 21 may be referred to as "upper" or "above" and the downsides may be referred to as "lower" or "below". Further, "horizontal" in this specification is not limited to a completely horizontal state, but includes states inclined slightly e.g. less than 10° relative to the horizontal state. Furthermore, "vertical" in this specification is not limited to a completely vertical state, but includes states inclined slightly e.g. less than 10° relative to the vertical state unless transport of electronic components is disturbed.

A robot system 100 shown in FIG. 1 includes a robot 1 and a robot control apparatus 200 that controls the robot 1.

The robot 1 is a single-arm six-axis vertical articulated robot in the embodiment, and an end effector 20 may be attached to the distal end portion thereof. Note that the robot 1 is the single-arm articulated robot, however, not limited to that. The robot may be e.g. a dual-arm articulated robot, a scalar robot (horizontal articulated robot), or the like.

The robot control apparatus 200 is placed apart from the robot 1 and may include e.g. a computer with a CPU (Central Processing Unit) as an example of a processor provided therein. As shown in FIG. 2, the robot system 100 may perform a coupling work of coupling a flexible flat cable 93 to a connector 92 provided on a substrate 91, and thereby, an electronic component assembly 9 is obtained.

As shown in FIG. 1, the robot 1 has a base 11 and a movable unit 10 also called a robot arm. The base 11 is a supporter that driveably supports the movable unit 10 from the downside and fixed to e.g. a floor of a factory. In the robot 1, the base 11 is electrically coupled to the robot control apparatus 200 via a relay cable 18. Note that the coupling between the robot 1 and the robot control apparatus 200 is not limited to the wired coupling like the configuration shown in FIG. 1, but may be e.g. wireless coupling or coupling via a network such as the Internet.

The movable unit 10 has a plurality of arms 101 pivotably coupled to each other. In the embodiment, the movable unit 10 has a first arm 12, a second arm 13, a third arm 14, a fourth arm 15, a fifth arm 16, and a sixth arm 17 as the plurality of arms 101, and these arms 12, 13, 14, 15, 16, 17 are sequentially coupled from the base 11 side. Note that the number of the arms 101 of the movable unit 10 is not limited to six, but may be e.g. one to five, seven, or more. The sizes including entire lengths of the respective arms 101 are respectively not particularly limited, but can be appropriately set.

The base 11 and the first arm 12 are coupled via a joint 171. Further, the first arm 12 is pivotable about a first pivot axis parallel to the vertical direction as a pivot center relative to the base 11. The first pivot axis is aligned with a normal of the floor to which the base 11 is fixed.

The first arm 12 and the second arm 13 are coupled via a joint 172. Further, the second arm 13 is pivotable about a second pivot axis parallel to the horizontal direction as a pivot center relative to the first arm 12. The second pivot axis is parallel to an axis orthogonal to the first pivot axis.

The second arm 13 and the third arm 14 are coupled via a joint 173. Further, the third arm 14 is pivotable about a third pivot axis parallel to the horizontal direction as a pivot center relative to the second arm 13. The third pivot axis is parallel to the second pivot axis.

The third arm 14 and the fourth arm 15 are coupled via a joint 174. Further, the fourth arm 15 is pivotable about a fourth pivot axis parallel to the center axis direction of the third arm 14 as a pivot center relative to the third arm 14. The fourth pivot axis is orthogonal to the third pivot axis.

The fourth arm 15 and the fifth arm 16 are coupled via a joint 175. Further, the fifth arm 16 is pivotable about a fifth pivot axis as a pivot center relative to the fourth arm 15. The fifth pivot axis is orthogonal to the fourth pivot axis.

The fifth arm 16 and the sixth arm 17 are coupled via a joint 176. Further, the sixth arm 17 is pivotable about a sixth pivot axis as a pivot center relative to the fifth arm 16. The sixth pivot axis is orthogonal to the fifth pivot axis. Furthermore, the sixth arm 17 is a robot distal end portion located at the most distal end side of the movable unit 10. The sixth arm 17 may pivot together with the end effector 20 by driving of the movable unit 10.

The end effector 20 is a gripping unit 201 configured to grip the flat cable 93. The gripping unit 201 has a pair of nipping pieces 202 that nip the flat cable 93, and may grip the flat cable 93 by the nipping. Note that the gripping unit 201 is not limited to one that grips the flat cable 93 by nipping, but may be e.g. one that grips the flat cable 93 by suction.

As described above, the robot system 100 is used for a coupling work of coupling the flexible flat cable 93 to the connector 92 provided on the substrate 91. As shown in FIG. 2, the substrate 91 is a circuit board having a flat plate shape and a circuit pattern (not shown) formed on an upper surface as a principal surface. The connector 92 and a seat 94 are fixed to the principal surface.

As shown in FIG. 3, the connector 92 has an insertion hole 920 into which the flat cable 93 is inserted, and a plurality of terminals (not shown) exposed within the insertion hole 920 and electrically coupled to the circuit pattern. The insertion hole 920 opens toward a direction parallel to the upper surface of the substrate 91, i.e., toward the left side in FIG. 3. In the embodiment, the connector 92 is a NON-ZIF connector. The NON-ZIF connector is also referred to as "N-ZIF connector" or "one-action connector". The flat cable 93 is inserted into the insertion hole 920, and thereby, the flat cable 93 and the connector 92 are electrically coupled. Note that the insertion hole 920 has an internal space substantially in a rectangular parallelepiped shape, and has an upper surface 920a located at the upside, a bottom surface 920b located at the downside, and an abutting surface 920c located at the depth side as the backside of the insertion hole 920, i.e., the opposite side to the opening of the insertion hole 920.

Note that the connector 92 is not limited to the NON-ZIF connector, but may be e.g. a ZIF connector. The ZIF connector is not particularly limited, but e.g. the so-called "two-action connector" having a connector main body and a lid body pivotably supported on the connector main body may be used. In such a connector, the lid body is opened prior to insertion of the flat cable 93, the flat cable 93 is inserted, and then, the lid body is closed to fix the flat cable 93 and the connector 92.

As shown in FIG. 3, the seat 94 is integrally formed with the connector 92. Further, the seat 94 is placed at the front side of the connector 92, i.e., the side at which the insertion hole 920 opens. Furthermore, the seat 94 has an introduction surface 941 continuously coupled to the bottom surface 920b of the insertion hole 920. That is, the introduction surface 941 is continuous to the lower edge of the insertion hole 920. Note that "continuously coupled" means that the bottom surface 920b and the introduction surface 941 are coupled without any substantial level difference in between. Particularly, in the embodiment, the introduction surface 941 is flush with the bottom surface 920b and located on a plane F containing the bottom surface 920b. That is, the bottom surface 920b and the introduction surface 941 are formed from a single planar surface.

As shown in FIG. 4, the flat cable 93 is e.g. an FPC (Flexible Printed Circuits) or an FFC (Flexible Flat Cable) having a flat cross section, flexibility, and elongated shape. That is, the flat cable 93 does not include a flat LAN cable for LAN connection or a flat USB cable for USB connection.

In the end part of the flat cable 93, a coupling end portion 931 inserted into the connector 92 and having a plurality of terminals 931a electrically coupled to the respective terminals of the connector 92 in the inserted state is provided. Further, in the middle of the flat cable 93 in the longitudinal direction, at the immediate back side of the coupling end portion 931 in illustrated configuration, a tab 932 in a small slip shape is formed to project. The tab 932 is formed by a part of a reinforcing plate 933 made of a PET film that reinforces the end part of the flat cable 93. When the gripping unit 201 grips the flat cable 93, the unit may perform the gripping operation by nipping the tab 932.

The robot system 100 having the above described configuration may execute a coupling method of coupling the flat cable 93 to the connector 92 on the substrate 91. As shown in FIG. 5, the coupling method has a preparation step, a first moving step, and a pressing step. When the robot system 100 executes the coupling method, the robot control apparatus 200 controls the robot 1 to perform a first moving operation at the first moving step and perform a pressing operation at the pressing step.

Note that, hereinafter, for convenience of explanation, an X-axis and a Y-axis along the horizontal direction and orthogonal to each other and a Z-axis along the vertical direction and orthogonal to the X-axis and the Y-axis are shown in FIGS. 6 to 10. Further, directions along the X-axis are also referred to as "X-axis directions", directions along the Y-axis are also referred to as "Y-axis directions", and directions along the Z-axis are also referred to as "Z-axis directions". Furthermore, arrow directions of the respective axes are also referred to as "plus sides" and the opposite sides are also referred to as "minus sides".

[1] Preparation Step

Figure 6:
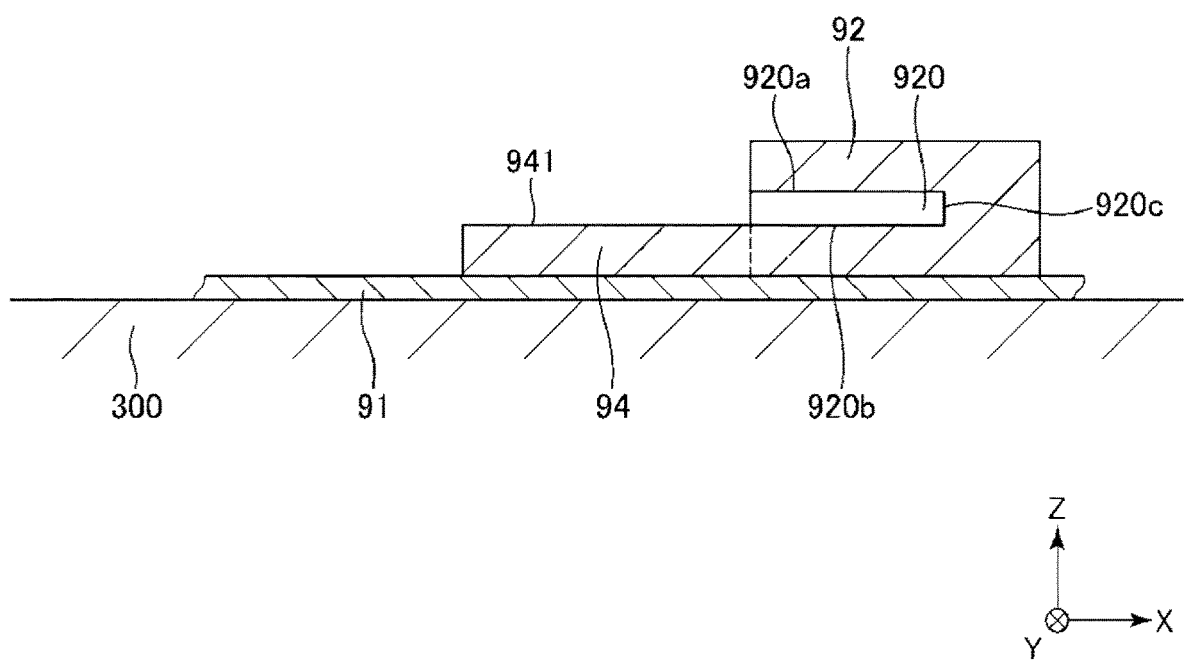
FIG. 6 is a sectional view showing the coupling method of coupling the flat cable to the connector.

The preparation step is a step of preparing the robot 1 provided with the gripping unit 201 and the robot control apparatus 200. Here, "preparation" refers to an activation of the robot system 100 to be operable when the robot system 100 performs the coupling work. Further, at the preparation step, as shown in FIG. 6, the substrate 91 including the connector 92 and the seat 94 is prepared in a state held on a workbench 300 in a horizontal posture. The state is maintained until the work ends. As described above, the insertion hole 920 opens in the direction parallel to the upper surface of the substrate 91 and, in this state, opens in the horizontal direction, specifically, toward the minus side in the X-axis direction.

Further, at the preparation step, the flat cable 93 is also prepared on a workbench (not shown) different from the workbench 300 in advance. Then, the gripping unit 201 may grip and transport the tab 932 of the flat cable 93 from the workbench at the first moving step as the next step.

[2] First Moving Step

The first moving step is a step of performing the first moving operation of moving the flat cable 93 to a position above the seat 94, i.e., at the plus side in the Z-axis direction and facing the seat 94. At the step, first, the robot 1 is driven to grip the tab 932 of the flat cable 93 by the gripping unit 201. Then, the robot 1 is driven to move the flat cable 93 to above the seat 94, i.e., the plus side in the Z-axis direction as shown in FIG. 7.

Figure 7:
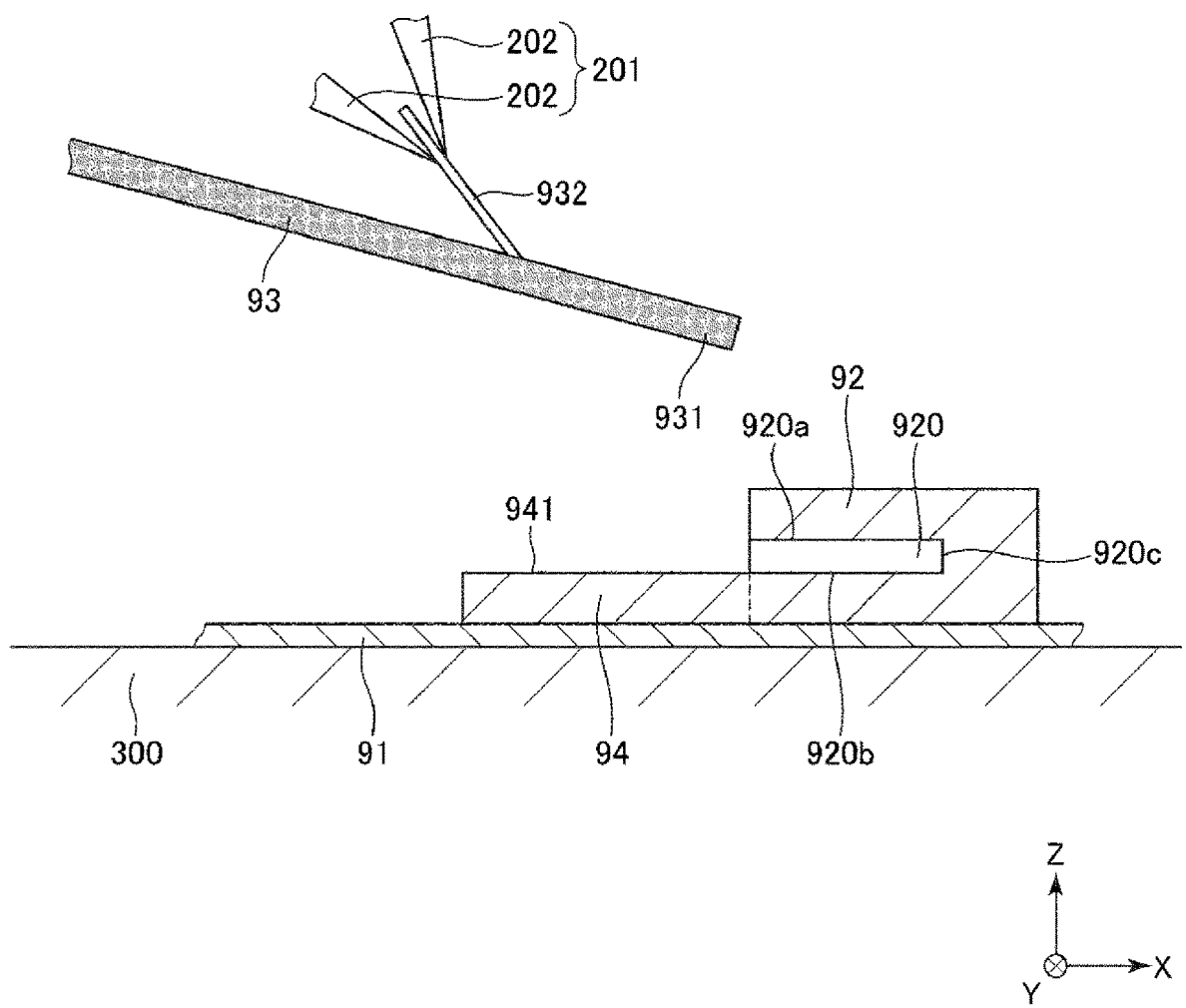
FIG. 7 is a sectional view showing the coupling method of coupling the flat cable to the connector.

As shown in FIG. 7, it is preferable to move the flat cable 93 to above the seat 94 with the tab 932 of the flat cable 93 nipped so that the nipping direction by the gripping unit 201 may be upward and downward directions. By the gripping in the direction, release of the flat cable 93 from the gripping unit 201 during the movement is suppressed.

Note that, in the embodiment, the movable unit 10 of the robot 1 is driven to move the flat cable 93 to above the seat 94, however, the moving method is not limited to that. For example, with the movable unit 10 fixed, the workbench 300 may be moved to move the flat cable 93 to above the seat 94. Or, both the movable unit 10 and the workbench 300 may be moved to move the flat cable 93 to above the seat 94.

[3] Pressing Step

Figure 8:
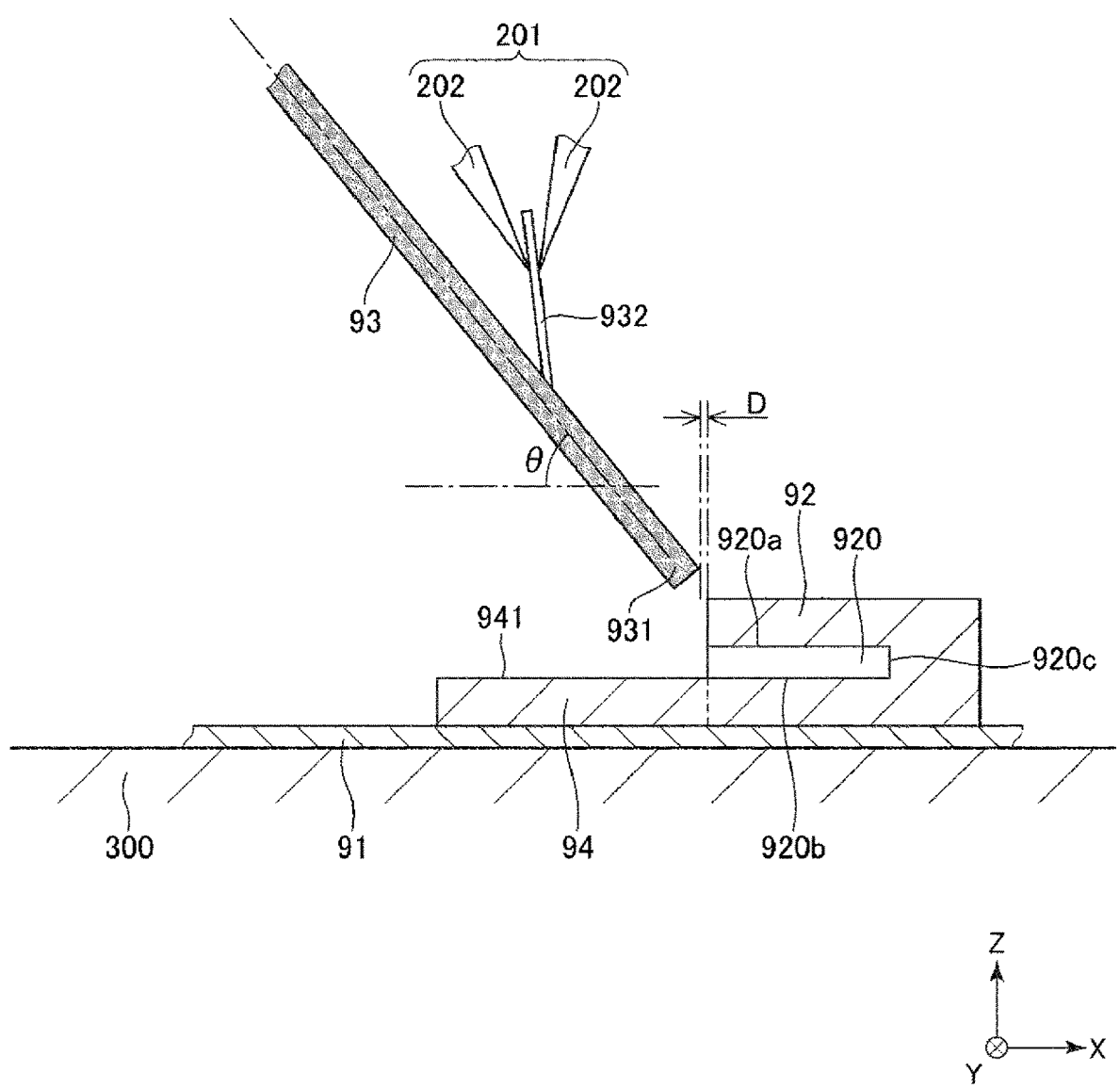
FIG. 8 is a sectional view showing the coupling method of coupling the flat cable to the connector.

The pressing step is a step of performing the pressing operation of pressing the flat cable 93 against the introduction surface 941 of the seat 94. At the step, first, as shown in FIG. 8, the robot 1 is driven to set the flat cable 93 in the width direction along the Y-axis and further set the flat cable 93 in a posture inclined relative to the introduction surface 941 of the seat 94 so that the coupling end portion 931 as the end thereof may face the insertion hole 920 side, i.e., downward. Hereinafter, the inclination of the coupling end portion 931 relative to the introduction surface 941 is referred to as "inclination A". In this state, the coupling end portion 931 of the flat cable 93 is apart from the seat 94. Further, in a plan view from the Z-axis direction, the coupling end portion 931 does not overlap with the connector 92 and is located at the minus side in the X-axis direction of the connector 92. Hereinafter, a separation distance between the coupling end portion 931 and the connector 92 as seen from the Z-axis direction is referred to as "separation distance D".

Note that, for example, during the above described first moving step, more specifically, while moving the flat cable 93 to above the seat 94, the above described posture may be set. Thereby, a work time may be shortened.

Figure 9:
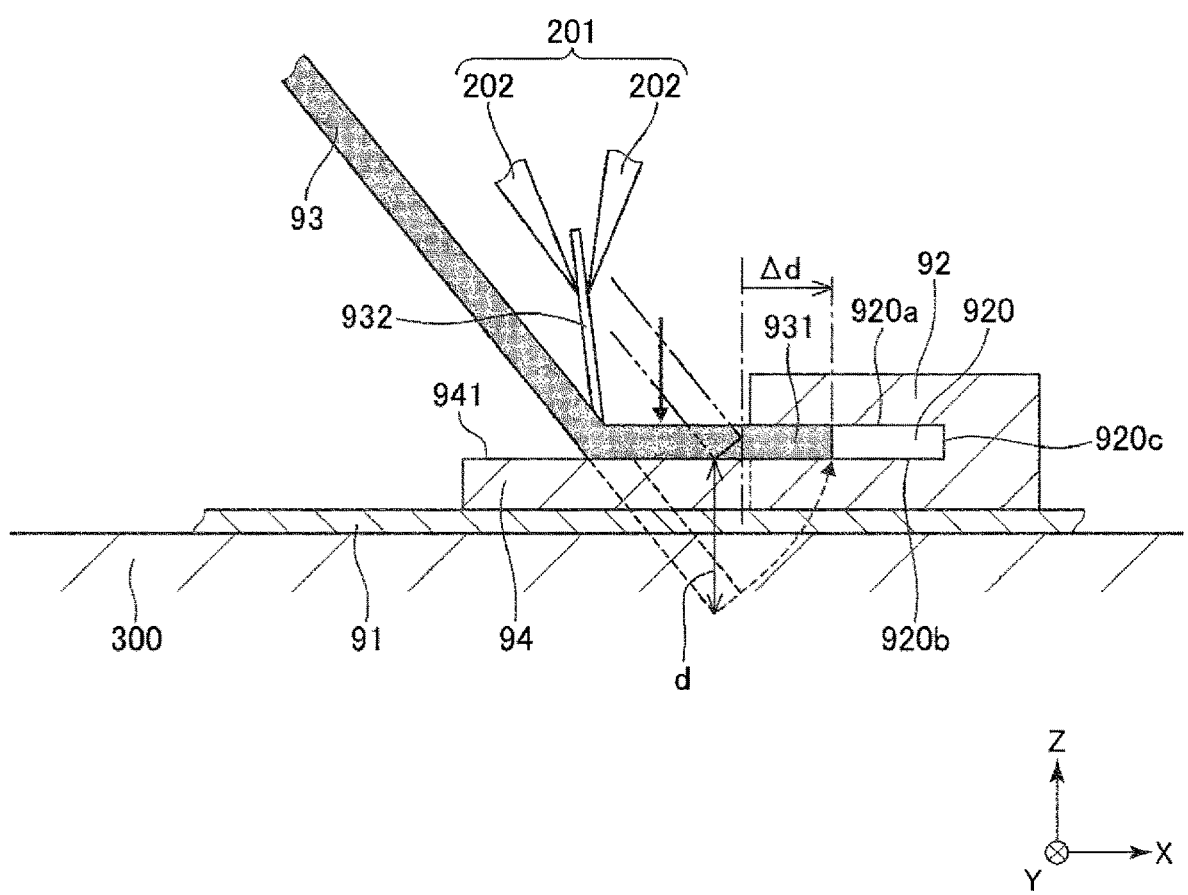
FIG. 9 is a sectional view showing the coupling method of coupling the flat cable to the connector.

Then, as shown in FIG. 9, the robot 1 is driven to bring the coupling end portion 931 into contact with the introduction surface 941 and further press the portion against the surface with the posture of the flat cable 93 maintained. Thereby, because of the flexibility of the flat cable 93, the portion pressed against the introduction surface 941 bends along the introduction surface 941, and the coupling end portion 931 moves toward the connector 92 side, i.e., the plus side in the X-axis direction along the introduction surface 941 by the bending. When the movement distance is $\Delta d$ and the pressing distance (the movement distance toward the minus side in the Z-axis direction) after the coupling end portion 931 contacts the introduction surface 941 is d, a relationship $\Delta d = d(1-\cos\theta)/\sin\theta$ holds. When the movement distance $\Delta d$ is larger than the separation distance D, the coupling end portion 931 is inserted into the insertion hole 920 from the opening of the insertion hole 920 while sliding on the introduction surface 941. As described above, the coupling end portion 931 is pressed against the introduction surface 941 and the coupling end portion 931 is moved toward the connector 92 side along the introduction surface 941, and thereby, the coupling end portion 931 is inserted into the insertion hole 920 of the connector 92 and the coupling end portion 931 and the connector 92 are mechanically and electrically coupled. Note that, as described above, the introduction surface 941 and the bottom surface 920b are flush with each other and there is no level difference between the surfaces, and thus, the flat cable 93 may be smoothly guided from the introduction surface 941 into the insertion hole 920.

At the above described preparation step, first moving step, and pressing step, the coupling between the flat cable 93 and the connector 92 is completed. According to the coupling method, the flat cable 93 is only pressed against the introduction surface 941, and thereby, the flat cable 93 and the connector 92 may be coupled. Therefore, the coupling work between the flat cable 93 and the connector 92 may be performed more easily. Further, the work is not influenced by variations in the position of the flat cable 93 in the Z-axis direction at the start of the pressing step, and thus, the time taken for positioning of the flat cable 93 may be shortened. Furthermore, the coupling end portion 931 of the flat cable 93 may be inserted into the insertion hole 920 from the front side of the insertion hole 920, and thus, the NON-ZIF connector 92 may be preferably used. According to the NON-ZIF connector 92, one-action coupling can be performed, and thereby, the time taken for the coupling work (cycle time) may be shortened compared to a case where the ZIF connector 92 requiring two-action is used.

Note that, in the embodiment, the movable unit 10 of the robot 1 is driven to press the flat cable 93 against the introduction surface 941, however, the pressing method is not limited to that. For example, with the movable unit 10 fixed, the workbench 300 may be moved toward the plus side in the Z-axis direction to press the flat cable 93 against the introduction surface 941. Or, both the movable unit 10 and the workbench 300 may be moved to press the flat cable 93 against the introduction surface 941.

Figure 10:
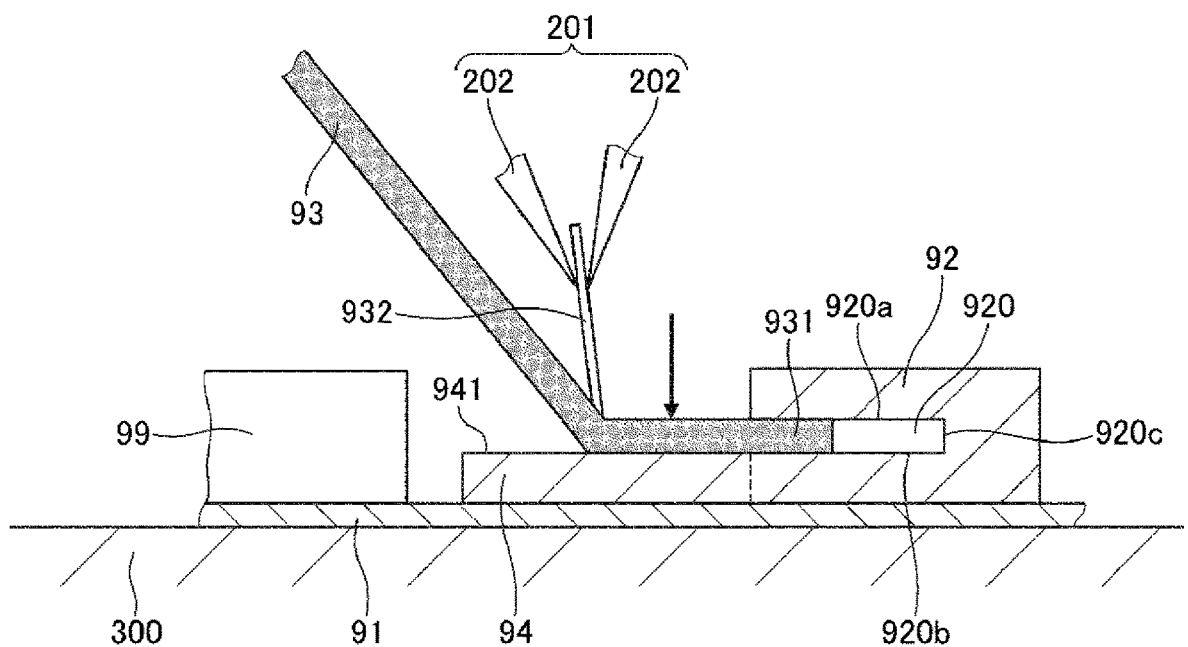
FIG. 10 is a sectional view showing the coupling method of coupling the flat cable to the connector.

The inclination θ is not particularly limited, but preferably from 10° to 50°, more preferably from 20° to 50°, and even more preferably from 30° to 40°, for example. The inclination θ is set to 10° or more, and thereby, bending of the flat cable 93 under its own weight may be effectively suppressed and the pressing step may be performed more smoothly. Or, as shown in FIG. 10, even when another circuit element 99 is placed near the connector 92, interferences with the circuit element 99 may be effectively suppressed. On the other hand, the inclination θ is set to 50° or less, and thereby, difficulty in sliding of the coupling end portion 931 on the introduction surface 941 may be suppressed and the coupling end portion 931 may be smoothly moved toward the connector 92. Further, bending of the coupling end portion 931 in an unintended direction not toward the plus side in the X-axis direction, particularly, toward the minus side in the X-axis direction may be effectively suppressed.

The separation distance D is not particularly limited, but the smaller, the more preferable. Specifically, the distance is preferably equal to or smaller than 1 mm, more preferably equal to or smaller than 0.5 mm, and even more preferably equal to or smaller than 0.1 mm. As described above, the smaller the separation distance D, the deeper the insertion depth of the coupling end portion 931 into the connector 92, and thus, the coupling between the coupling end portion 931 and the connector 92 may be performed more reliably.

As above, the coupling method and the robot system 100 of the embodiment are explained. As described above, the coupling method is the coupling method of coupling the flexible flat cable 93 to the connector 92 by the robot 1, and includes the preparation step of preparing the connector 92 having the insertion hole 920 into which the flat cable 93 is inserted and the seat 94 having the introduction surface 941 placed at the front side of the insertion hole 920 and continuously coupled to the insertion hole 920, the first moving step of gripping the flat cable 93 and moving the flat cable 93 to the position facing the seat 94, and the pressing step of bringing the flat cable 93 into contact with the introduction surface 941 in the inclined posture relative to the seat 94 with the coupling end portion 931 as the end of the flat cable 93 facing the insertion hole 920 side and pressing the cable against the surface, and moving the coupling end portion 931 toward the connector 92 side.

According to the method, the flat cable 93 is only pressed against the introduction surface 941, and thereby, the flat cable 93 and the connector 92 may be coupled. Therefore, the coupling work between the flat cable 93 and the connector 92 may be performed more easily. Further, the work is not influenced by variations in the position of the flat cable 93 in the Z-axis direction at the start of the pressing step, and thus, the time taken for positioning of the flat cable 93 may be shortened. Furthermore, the coupling end portion 931 of the flat cable 93 may be inserted into the insertion hole 920 from the front side of the insertion hole 920, and thus, the NON-ZIF connector 92 may be preferably used. According to the NON-ZIF connector 92, one-action coupling can be performed, and thereby, the time taken for the coupling work (cycle time) may be shortened compared to a case where the ZIF connector 92 requiring two-action is used.

Further, as described above, the robot system 100 is the robot system that performs the work of coupling the flexible flat cable 93 to the connector 92, and includes the robot 1 that grips the flat cable 93 and the robot control apparatus 200 that controls the robot 1. Further, the connector 92 has the insertion hole 920 into which the flat cable 93 is inserted, and the seat 94 having the introduction surface 941 continuously coupled to the insertion hole 920 is placed at the front side of the insertion hole 920. Furthermore, the robot control apparatus 200 controls the robot 1 to perform the first moving operation of gripping the flat cable 93 and moving the flat cable 93 to the position facing the seat 94, and the pressing operation of bringing the flat cable 93 into contact with the introduction surface 941 in the inclined posture relative to the seat 94 with the coupling end portion 931 as the end of the flat cable 93 facing the insertion hole 920 side and pressing the cable against the surface, and moving the coupling end portion 931 toward the connector 92 side.

According to the configuration, the flat cable 93 is only pressed against the introduction surface 941, and thereby, the flat cable 93 and the connector 92 may be coupled. Therefore, the coupling work between the flat cable 93 and the connector 92 may be performed more easily. Further, the work is not influenced by variations in the position of the flat cable 93 in the Z-axis direction at the start of the pressing step, and thus, the time taken for positioning of the flat cable 93 may be shortened. Furthermore, the coupling end portion 931 of the flat cable 93 may be inserted into the insertion hole 920 from the front side of the insertion hole 920, and thus, the NON-ZIF connector 92 may be preferably used. According to the NON-ZIF connector 92, one-action coupling can be performed, and thereby, the time taken for the coupling work (cycle time) may be shortened compared to a case where the ZIF connector 92 requiring two-action is used.

Second Embodiment

Figure 11:
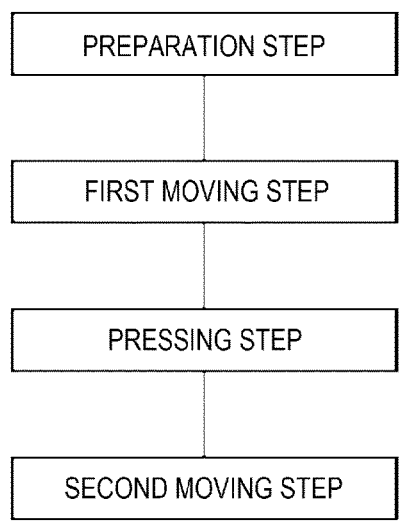
FIG. 11 is a process chart showing a coupling method according to a second embodiment.
Figure 12:
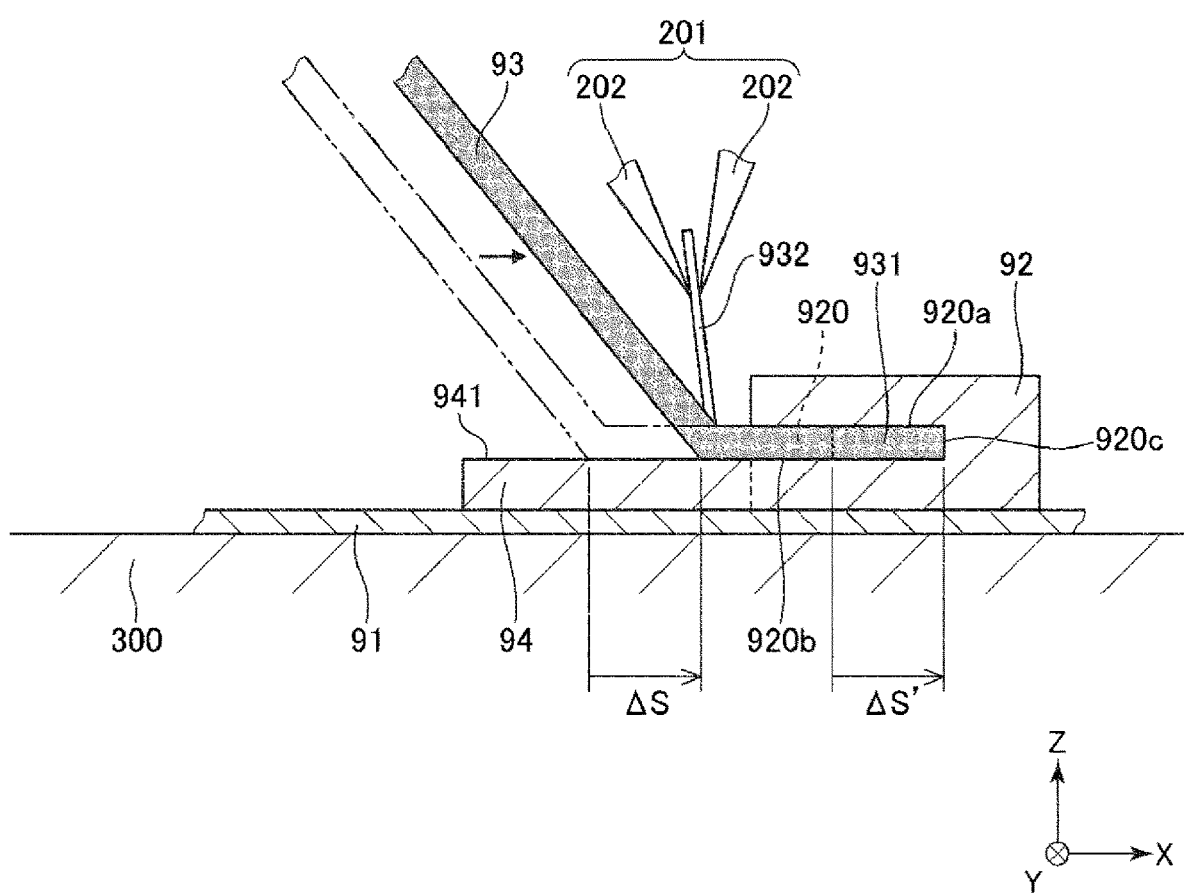
FIG. 12 is a sectional view showing the coupling method of coupling the flat cable to the connector.

FIG. 11 is a process chart showing a coupling method according to a second embodiment. FIG. 12 is a sectional view showing the coupling method of coupling the flat cable to the connector.

The coupling method and the robot system 100 of the embodiment are the same as the coupling method and the robot system 100 of the above described first embodiment except that a second moving step is performed after the pressing step. Note that, in the following description, the embodiment will be explained with a focus on the differences from the above described first embodiment and the explanation of the same items will be omitted. In FIGS. 11 and 12, the same configurations as those of the above described embodiment have the same signs.

As shown in FIG. 11, the coupling method has the preparation step, the first moving step, the pressing step, and the second moving step. Further, when the robot system 100 executes the coupling method, the robot control apparatus 200 controls the robot 1 to perform the first moving operation at the first moving step, perform the pressing operation at the pressing step, and perform a second moving operation at the second moving step. The preparation step, the first moving step, and the pressing step are the same as those of the above described first embodiment and the explanation thereof will be omitted and, as below, the second moving step will be explained in detail.

As is the case with the above described first embodiment, at the pressing step, the flat cable 93 is pressed against the introduction surface 941 and the coupling end portion 931 is moved toward the connector 92 side, and thereby, coupling between the flat cable 93 and the connector 92 may be performed. However, depending on the pressing distance d of the flat cable 93, the shape and the type of the connector 92, or the like, the coupling end portion 931 is not sufficiently deeply inserted into the connector 92 at only the pressing step and the coupling condition may be incomplete. Accordingly, in the embodiment, the second moving step of further moving the coupling end portion 931 toward the connector 92 side is performed after the pressing step, and thereby, the coupling end portion 931 may be deeply inserted into the connector 92.

[4] Second Moving Step

The second moving step is a step of performing the second moving operation of moving the coupling end portion 931 as the end of the flat cable 93 toward the connector 92 side, i.e., the plus side in the X-axis direction. At the step, as shown in FIG. 12, the robot 1 is driven to further move the flat cable 93 toward the connector 92 side, i.e., the plus side in the X-axis direction and insert the coupling end portion 931 into the connector 92 to a sufficient insertion depth, in the drawing, a depth in contact with the abutting surface 920c. Thereby, the flat cable 93 and the connector 92 may be coupled more reliably.

Here, it is preferable that a movement distance ΔS of the flat cable 93 at the second moving step is larger than a movement distance ΔS' necessary for proper deep insertion of the coupling end portion 931 into the connector 92, i.e., contact of the coupling end portion 931 with the abutting surface 920c. Thereby, the flat cable 93 and the connector 92 may be coupled more reliably. Note that an amount of movement exceeding the movement distance ΔS' is absorbed by bending of the flat cable 93, and thus, application of excessive stress to the flat cable 93 and the connector 92 may be suppressed.

Note that, in the embodiment, the movable unit 10 of the robot 1 is driven to move the flat cable 93 toward the connector 92 side, however, the moving method is not limited to that. For example, with the movable unit 10 fixed, the workbench 300 may be moved toward the minus side in the X-axis direction to move the flat cable 93 toward the connector 92 side. Or, both the movable unit 10 and the workbench 300 may be moved to move the flat cable 93 toward the connector 92 side.

As described above, the coupling method of the embodiment includes the second moving step of further moving the coupling end portion 931 as the end toward the connector 92 side after the pressing step. Thereby, the flat cable 93 and the connector 92 may be coupled more reliably.

According to the second embodiment, the same effects as those of the above described first embodiment may be exerted.

Third Embodiment

Figure 13:
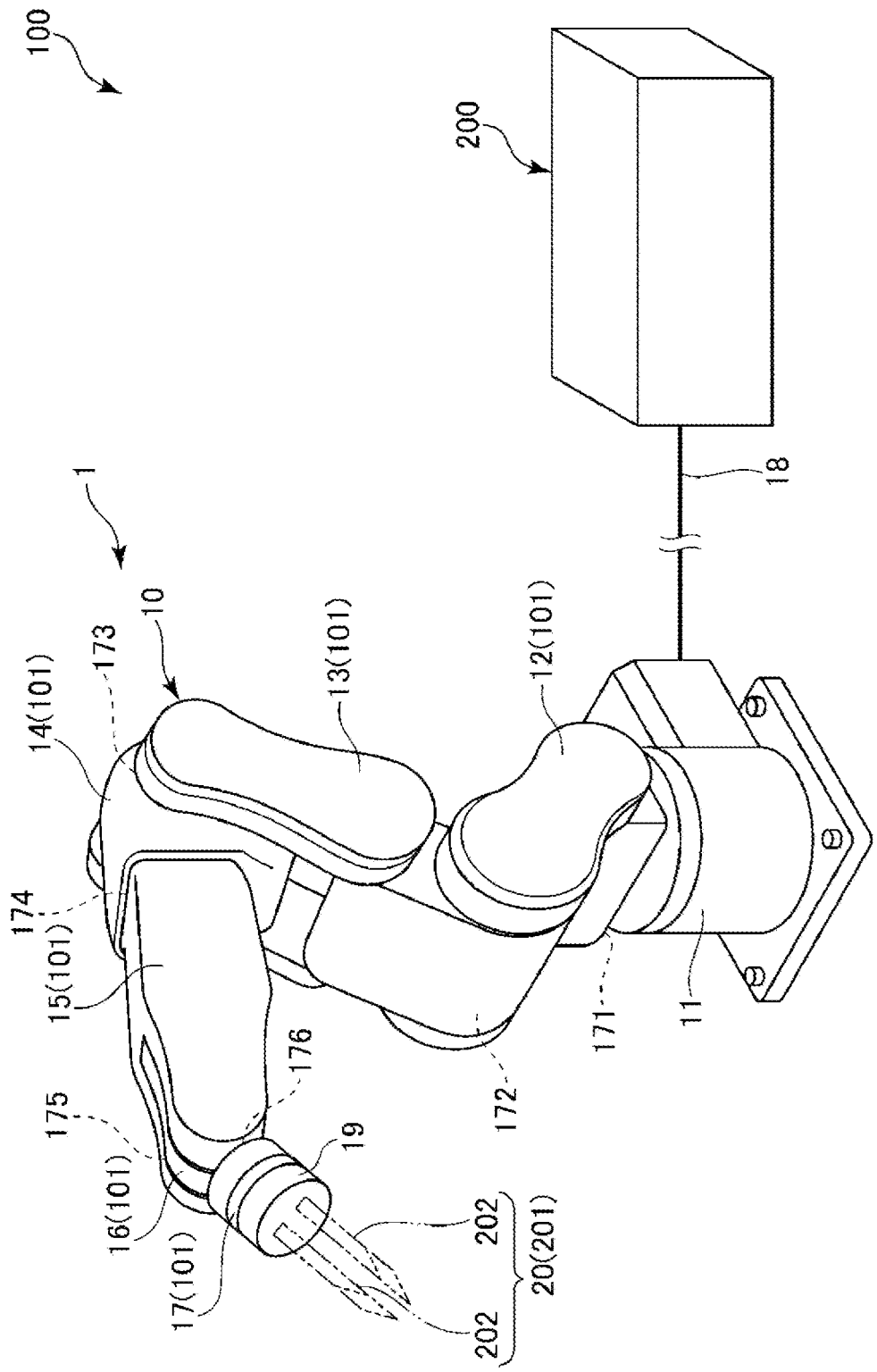
FIG. 13 is an overall configuration diagram showing a robot system according to a third embodiment.

FIG. 13 is an overall configuration diagram showing a robot system according to a third embodiment.

The coupling method and the robot system 100 of the embodiment are the same as the coupling method and the robot system 100 of the above described second embodiment except that the robot system 100 has a force sensor 19 and feeds back a detection result of the force sensor 19 to the coupling work. Note that, in the following description, the embodiment will be explained with a focus on the differences from the above described second embodiment and the explanation of the same items will be omitted. In FIG. 13, the same configurations as those of the above described embodiments have the same signs.

As shown in FIG. 13, the robot system 100 of the embodiment has the force sensor 19 that detects a force. Further, the force sensor 19 is detachably placed in the movable unit 10 of the robot 1. In the embodiment, the force sensor 19 is placed between the sixth arm 17 and the end effector 20. Note that the placement position of the force sensor 19 is not particularly limited, but, in the other arm 101 or between the adjacent arms 101, for example. Or, the force sensor may be placed in the workbench 300 supporting the substrate 91, not in the robot 1, or placed in both the robot 1 and the workbench 300.

The force sensor 19 may detect a force acting on the gripping unit 201 when the robot 1 performs the coupling work etc. The force sensor 19 is not particularly limited, but a six-axis force sensor that can detect force components in the respective axial directions of the X-axis, the Y-axis, Z-axis orthogonal to one another, a force component about the X-axis, a force component about the Y-axis, and a force component about the Z-axis in the embodiment is used. The output, i.e., the detection value of the force sensor 19 is input to the robot control apparatus 200 or another control unit and subjected to predetermined processing, and used for determinations of contact with the introduction surface 941 of the coupling end portion 931 and the abutting surface 920c or the like.

Next, the coupling method between the flat cable 93 and the connector 92 will be explained. The coupling method is the same as that of the above described second embodiment and has the preparation step, the first moving step, the pressing step, and the second moving step. As below, the pressing step and the second moving step using the detection result of the force sensor 19 will be explained.

[3] Pressing Step

At the pressing step, a force generated by pressing of the coupling end portion 931 of the flat cable 93 against the introduction surface 941 is detected by the force sensor 19. Accordingly, the robot control apparatus 200 may detect that the coupling end portion 931 of the flat cable 93 is pressed against the introduction surface 941 and further detect the pressing distance d based on the output of the force sensor 19. Therefore, the pressing step may be accurately performed using the detection result of the force sensor 19.

[4] Second Moving Step

At the second moving step, a force generated by pressing of the coupling end portion 931 of the flat cable 93 against the connector 92 is detected by the force sensor 19. Accordingly, the robot control apparatus 200 may detect the coupling state between the flat cable 93 and the connector 92 based on the output of the force sensor 19.

For example, in a state in which the flat cable 93 is properly inserted into contact with the abutting surface 920c within the connector 92 and further insertion is restricted, a force larger than the previous force is generated between the coupling end portion 931 and the connector 92. Accordingly, the force is stored in the robot control apparatus 200 in advance as a threshold value indicating that the flat cable 93 and the connector 92 are properly coupled. Then, when the force detected by the force sensor 19 at about the same movement distance as the movement distance ΔS' exceeds the threshold value, the robot control apparatus 200 determines that the flat cable 93 and the connector 92 are properly coupled and stops the movement of the flat cable 93. As described above, the detection result of the force sensor 19 is used, and thereby, the coupling state between the flat cable 93 and the connector 92 may be easily and properly detected.

Or, for example, when the force sensor 19 detects a larger force due to the contact between the coupling end portion 931 and the connector 92, e.g. a force equal to or larger than the threshold value at e.g. a smaller movement distance relative to the movement distance ΔS', it is highly likely that the flat cable 93 is displaced in the Y-axis direction relative to the connector 92 and the coupling end portion 931 hits the edge of the connector 92 and fails to be inserted into the connector 92. Accordingly, in this case, the so-called "exploring operation" of once retracting the flat cable 93 toward the minus side in the X-axis direction, moving the cable in the Y-axis direction, and then, moving the cable toward the plus side in the X-axis direction again may be repeated until the flat cable 93 is properly inserted into the connector 92. Thereby, the flat cable 93 may be inserted into the connector 92 more reliably. Note that the flat cable 93 moves along the introduction surface 941, and thus, displacement relative to the connector 92 in the Z-axis direction is harder to occur. Therefore, it is necessary to perform the above described exploring operation only with respect to the Y-axis direction, and the efficiency is remarkably improved.

As described above, in the coupling method of the embodiment, the force sensor 19 that detects the contact between the flat cable 93 and the introduction surface 941 is placed. Then, the contact between the flat cable 93 and the introduction surface 941 is detected based on the output, i.e., the detection value of the force sensor 19. Thereby, the pressing step may be accurately performed. Further, at the second moving step, the contact between the flat cable 93 and the abutting surface 920c is detected based on the output of the force sensor 19, and thereby, the coupling state between the flat cable 93 and the connector 92 may be known more properly. Accordingly, the second moving step may be accurately performed.

According to the third embodiment, the same effects as those of the above described first embodiment may be exerted.

Fourth Embodiment

Figure 14:
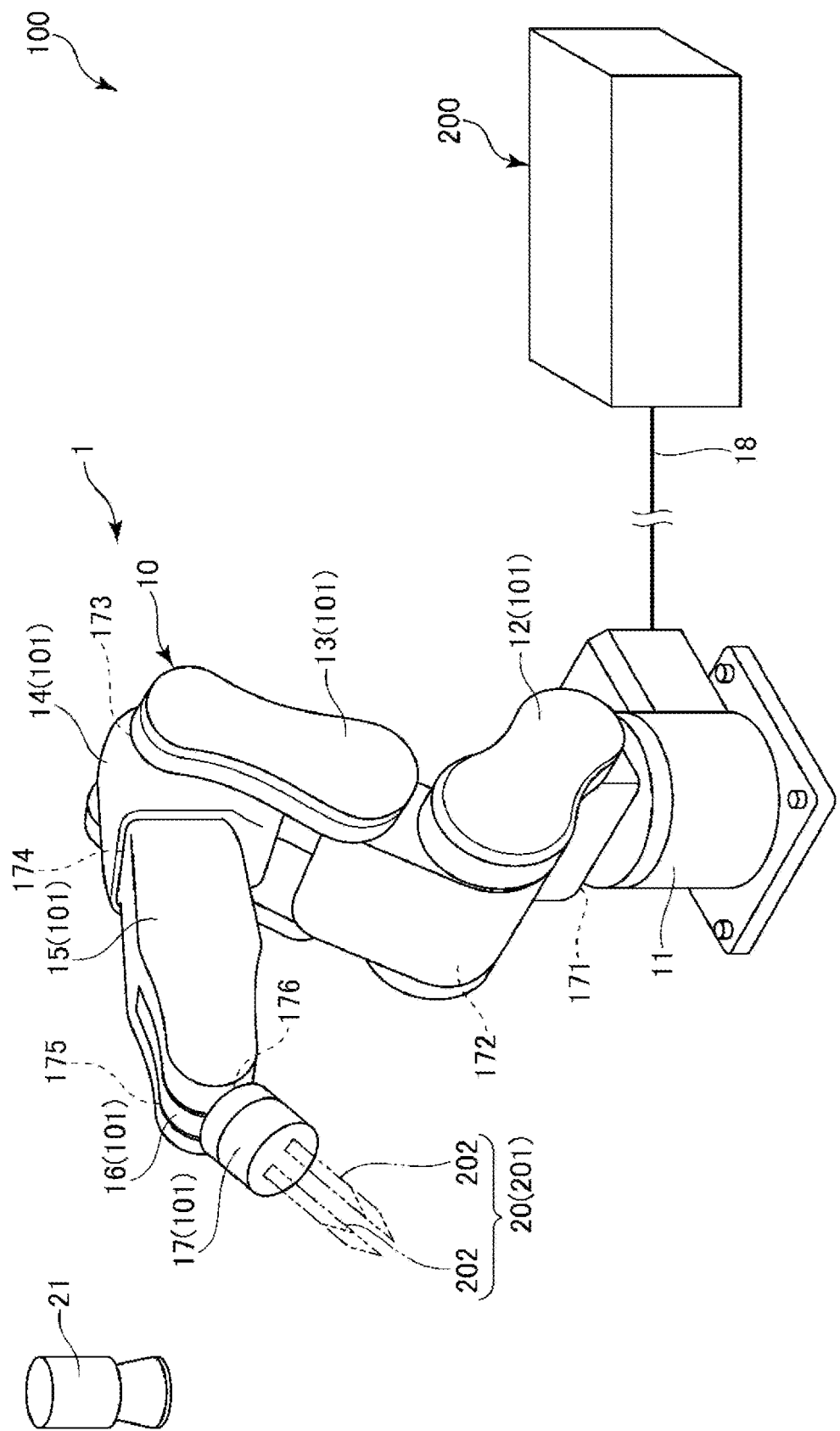
FIG. 14 is an overall configuration diagram showing a robot system according to a fourth embodiment.
Figure 15:
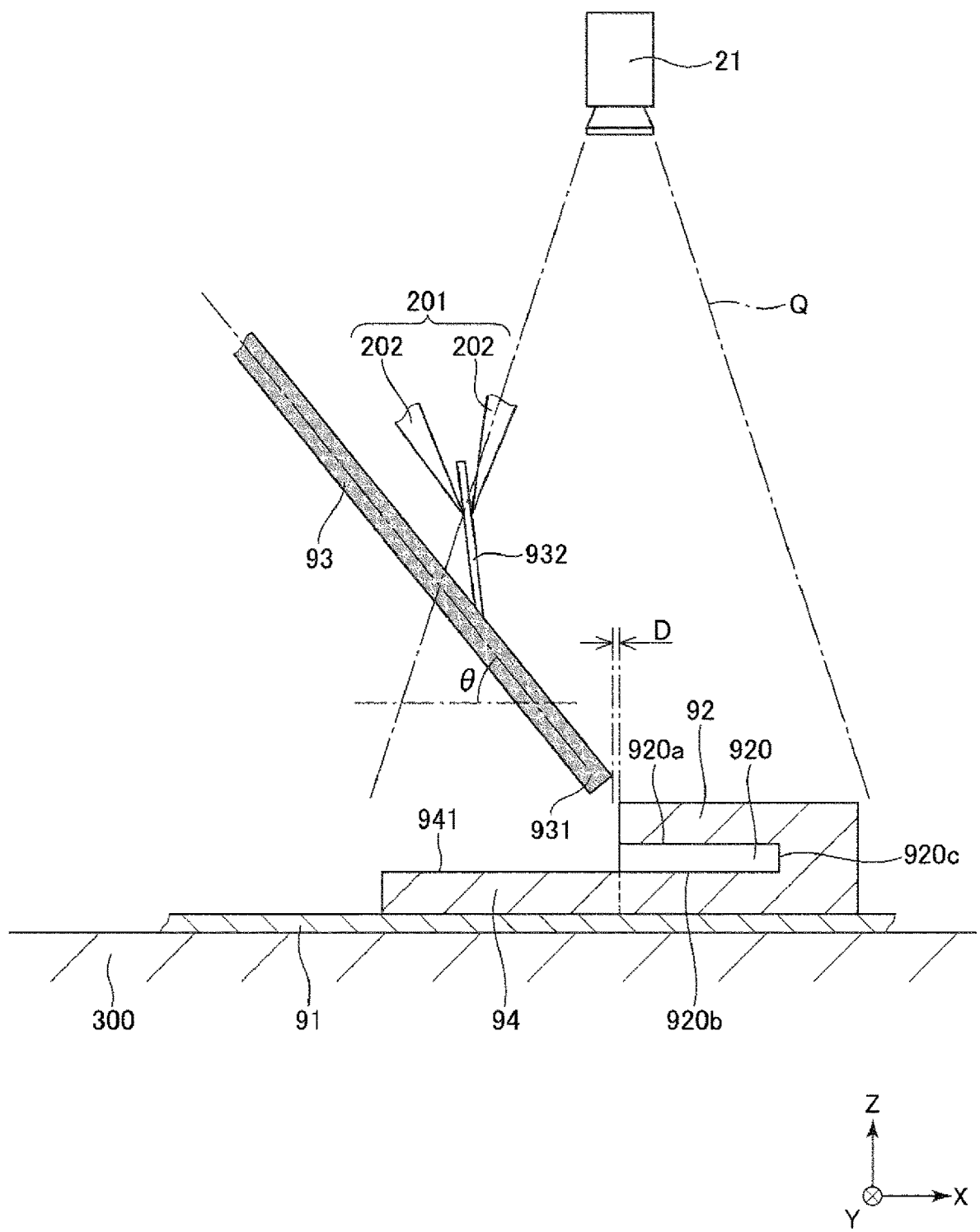
FIG. 15 is a sectional view showing an imaging region of a camera.

FIG. 14 is an overall configuration diagram showing a robot system according to a fourth embodiment. FIG. 15 is a sectional view showing an imaging region of a camera.

The coupling method and the robot system 100 of the embodiment are the same as the coupling method and the robot system 100 of the above described second embodiment except that the robot system 100 has a camera 21 as an imaging unit and feeds back a detection result of the camera 21 to the coupling work. Note that, in the following description, the coupling method and the robot system 100 of the embodiment will be explained with a focus on the differences from the above described second embodiment and the explanation of the same items will be omitted. In FIG. 14, the same configurations as those of the above described embodiments have the same signs.

As shown in FIG. 14, the robot system 100 of the embodiment has the camera 21 as the imaging unit. As shown in FIG. 15, the camera 21 may image a region Q containing the connector 92 and the seat 94. More specifically, the camera 21 can image the region Q in which the connector 92, the seat 94, and the coupling end portion 931 of the flat cable 93 may be collectively imaged at the pressing step and the second moving step. The camera 21 is placed above the workbench 300, i.e., at the plus side in the Z-axis direction. Note that the camera 21 is not particularly limited, but e.g. a CCD (Charge Coupled Device) camera or the like may be used. The placement location of the camera 21 is not particularly limited, but the camera may be placed on e.g. a ceiling, a wall surface, the robot 1, the workbench 300, or the like.

Image data of an image captured by the camera 21 is input to the robot control apparatus 200 or another control unit and subjected to predetermined processing, and used for knowing the position of the flat cable 93 relative to the connector 92.

Next, the coupling method between the flat cable 93 and the connector 92 will be explained. The coupling method is the same as that of the above described second embodiment and has the preparation step, the first moving step, the pressing step, and the second moving step. As below, the pressing step and the second moving step using the camera 21 will be explained.

[3] Pressing Step

At the pressing step, first, the robot control apparatus 200 detects a position relationship between the flat cable 93 and the connector 92, particularly, displacement in the Y-axis direction based on an imaging result of the camera 21 (hereinafter, also referred to as "first detection"). Then, the robot control apparatus 200 drives the robot 1 to adjust the position of the flat cable 93 relative to the seat 94 to eliminate the displacement in the Y-axis direction.

Further, the robot control apparatus 200 detects the separation distance D, the inclination θ, and a position of the flat cable 93 in the Z-axis direction based on the imaging result of the camera 21. Then, the robot control apparatus 200 drives the robot 1 to adjust the posture of the flat cable 93 so that the separation distance D, the inclination θ, and the position in the Z-axis direction may be respectively set values. Note that, for the detection of the inclination θ and the position in the Z-axis direction, e.g. template matching may be preferably used.

Then, the robot 1 is driven to press the coupling end portion 931 against the introduction surface 941 with the posture of the flat cable 93 maintained. Thereby, the portion pressed against the introduction surface 941 bends along the introduction surface 941, and the coupling end portion 931 moves toward the connector 92 side along the introduction surface 941 by the bending. The robot control apparatus 200 images the state by the camera 21 and detects the movement distance ΔS' necessary for bringing the coupling end portion 931 into contact with the abutting surface 920c based on the imaging result (hereinafter, also referred to as "second detection"). Then, the movement distance ΔS (≥ΔS') of the flat cable 93 at the second moving step is set based on the detected movement distance ΔS'. Thereby, the appropriate movement distance ΔS may be set according to each individual.

[4] Second Moving Step

The second moving step is a step of performing the second moving operation of moving the coupling end portion 931 as the end of the flat cable 93 toward the connector 92 side, i.e., the plus side in the X-axis direction. At the step, the robot control apparatus 200 drives the robot 1 to further move the flat cable 93 toward the connector 92 side, i.e., the plus side in the X-axis direction by the movement distance ΔS and insert the coupling end portion 931 into the connector 92 to a sufficient insertion depth. Thereby, the flat cable 93 and the connector 92 may be coupled more reliably.

As described above, in the coupling method of the embodiment, the camera 21 as the imaging unit that images the region containing the connector 92 and the seat 94 is placed. Further, the position of the flat cable 93 relative to the seat 94 is detected based on the imaging result of the camera 21. Thereby, the pressing step may be accurately performed. Also, the second moving step may be accurately performed using the image data of the camera 21.

According to the fourth embodiment, the same effects as those of the above described first embodiment may be exerted. Note that, in the embodiment, the first detection and the second detection are performed, however, one of the first detection and the second detection may be omitted. Further, different detection from the first detection and the second detection may be performed based on the imaging result of the camera 21.

Fifth Embodiment

Figure 16:
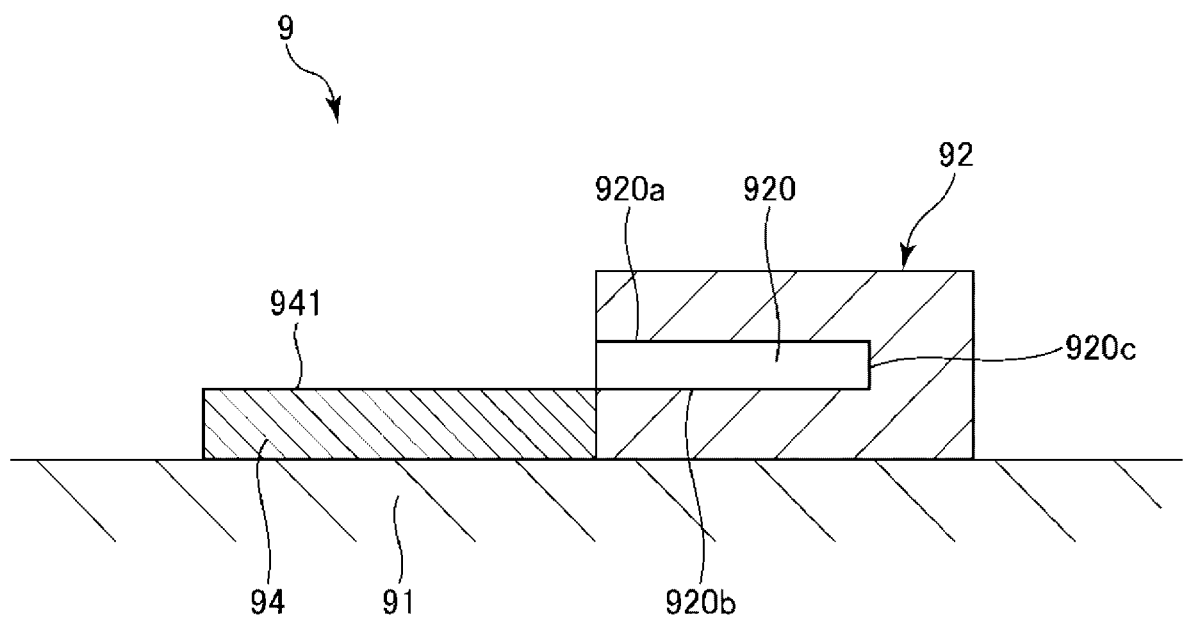
FIG. 16 is a sectional view showing a substrate according to a fifth embodiment.
Figure 17:
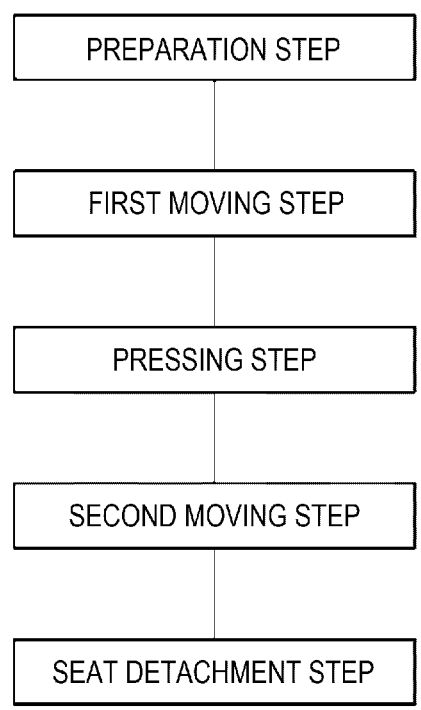
FIG. 17 is a process chart showing a coupling method of coupling the flat cable to the connector.

FIG. 16 is a sectional view showing a substrate according to a fifth embodiment. FIG. 17 is a process chart showing a coupling method of coupling the flat cable to the connector.

The coupling method and the robot system 100 of the embodiment are the same as the coupling method and the robot system 100 of the above described first embodiment except that the seat 94 is detachable from the connector 92 and a step of attaching and detaching the seat 94 to the connector 92 is provided. Note that, in the following description, the embodiment will be explained with a focus on the differences from the above described second embodiment and the explanation of the same items will be omitted. In FIG. 16, the same configurations as those of the above described embodiments have the same signs.

As shown in FIG. 16, in the robot system 100 of the embodiment, the seat 94 is formed separately from the connector 92 and detachable from the connector 92. Further, the seat 94 is attached to the connector 92 when necessary, that is, only when the coupling work of coupling the flat cable 93 to the connector 92 is performed and, after the coupling work ends, detached from the connector 92. Thereby, the seat 94 may be repeatedly used and the manufacturing cost of the substrate 91 may be reduced.

Next, the coupling method between the flat cable 93 and the connector 92 will be explained. As shown in FIG. 17, the coupling method has the preparation step, the first moving step, the pressing step, the second moving step, and a seat detachment step. The first moving step, the pressing step, and the second moving step are the same as those of the above described second embodiment. At the preparation step, for example, the seat 94 is attached to the connector 92 using another robot than the robot 1. On the other hand, at the seat detachment step, for example, the seat 94 is detached from the connector 92 using the other robot. Note that it is only necessary that the attachment of the seat 94 to the connector 92 may be performed before the pressing step.

As described above, in the coupling method of the embodiment, the seat 94 is detachable from the connector 92 and the seat detachment step of detaching the seat 94 from the connector 92 after the flat cable 93 is coupled to the connector 92 is provided. Thereby, the seat 94 may be repeatedly used and the manufacturing cost of the substrate 91 may be reduced. Further, when the seat 94 is attached to the connector 92, one type of the seat 94 having the predetermined shape, dimensions, etc. is attached, however, a plurality of types of seats 94 having different shapes, dimensions, etc. may be prepared in advance, one of the seats may be selected, and the selected seat 94 may be attached to the connector 92. Thereby, there is an advantage that the application ranges and work variations of the connector 92 and the flat cable 93 are wider.

According to the fifth embodiment, the same effects as those of the above described first embodiment may be exerted.

Sixth Embodiment

Figure 18:
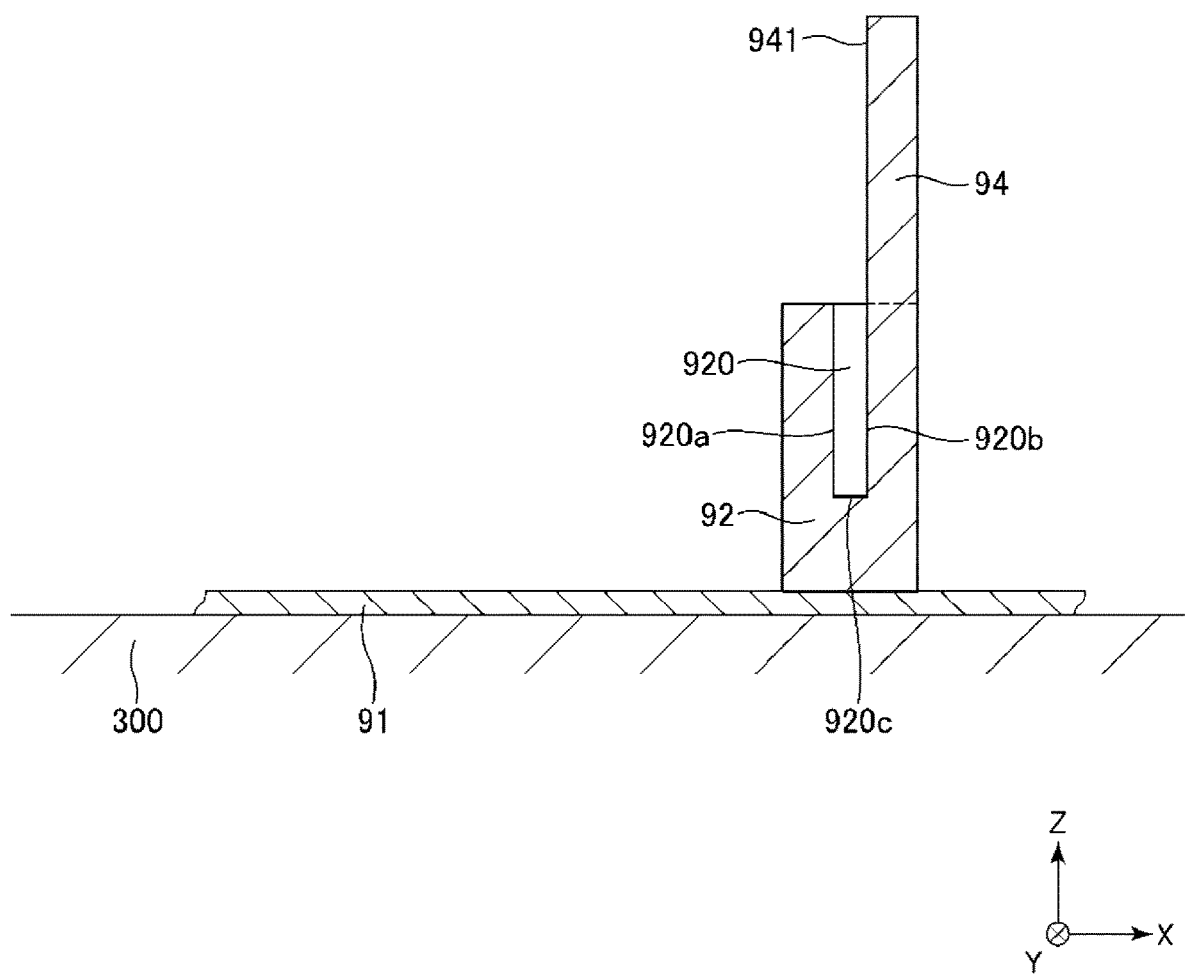
FIG. 18 is a sectional view showing a substrate according to a sixth embodiment.
Figure 19:
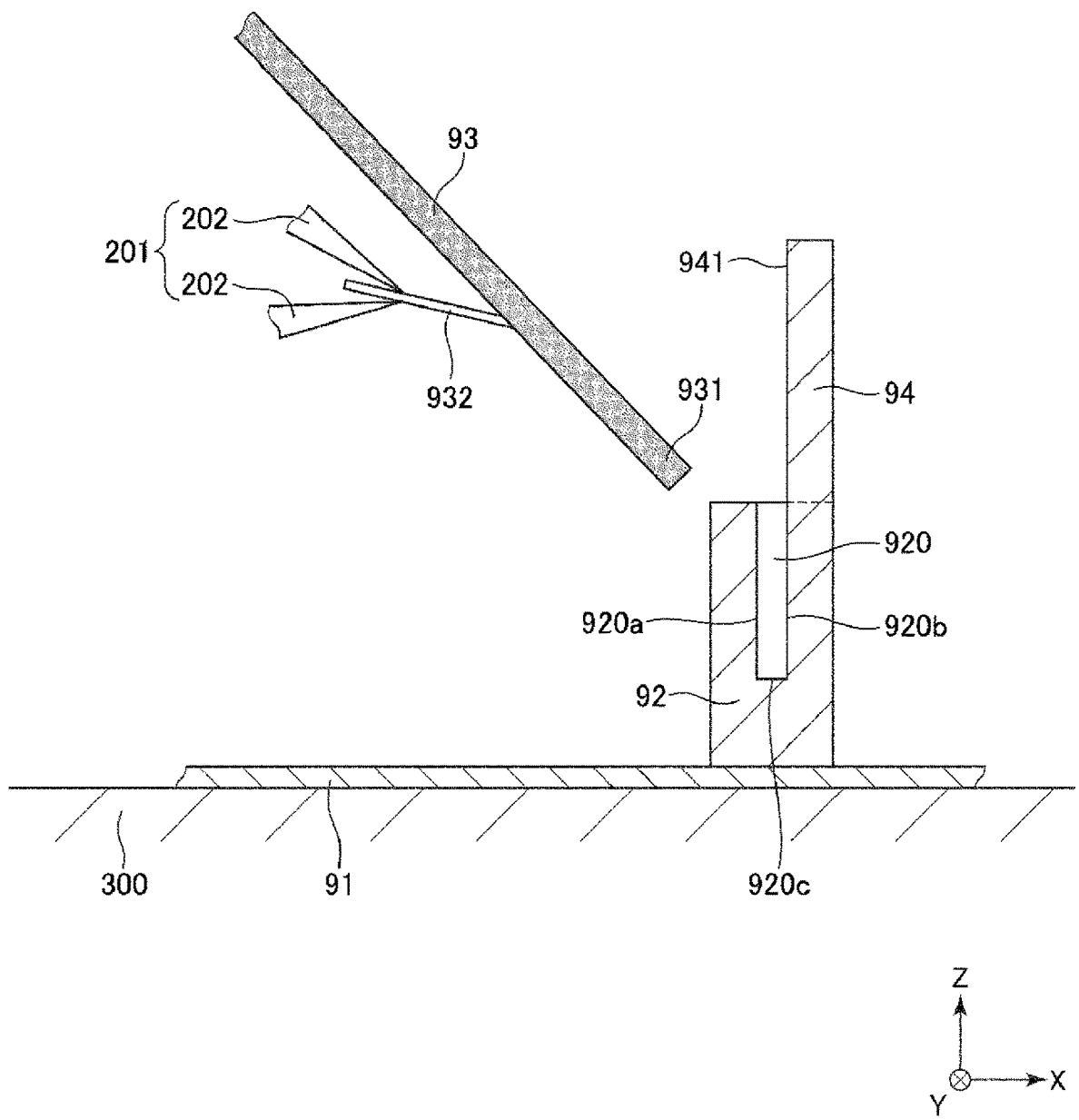
FIG. 19 is a sectional view showing a coupling method of coupling the flat cable to the connector.
Figure 20:
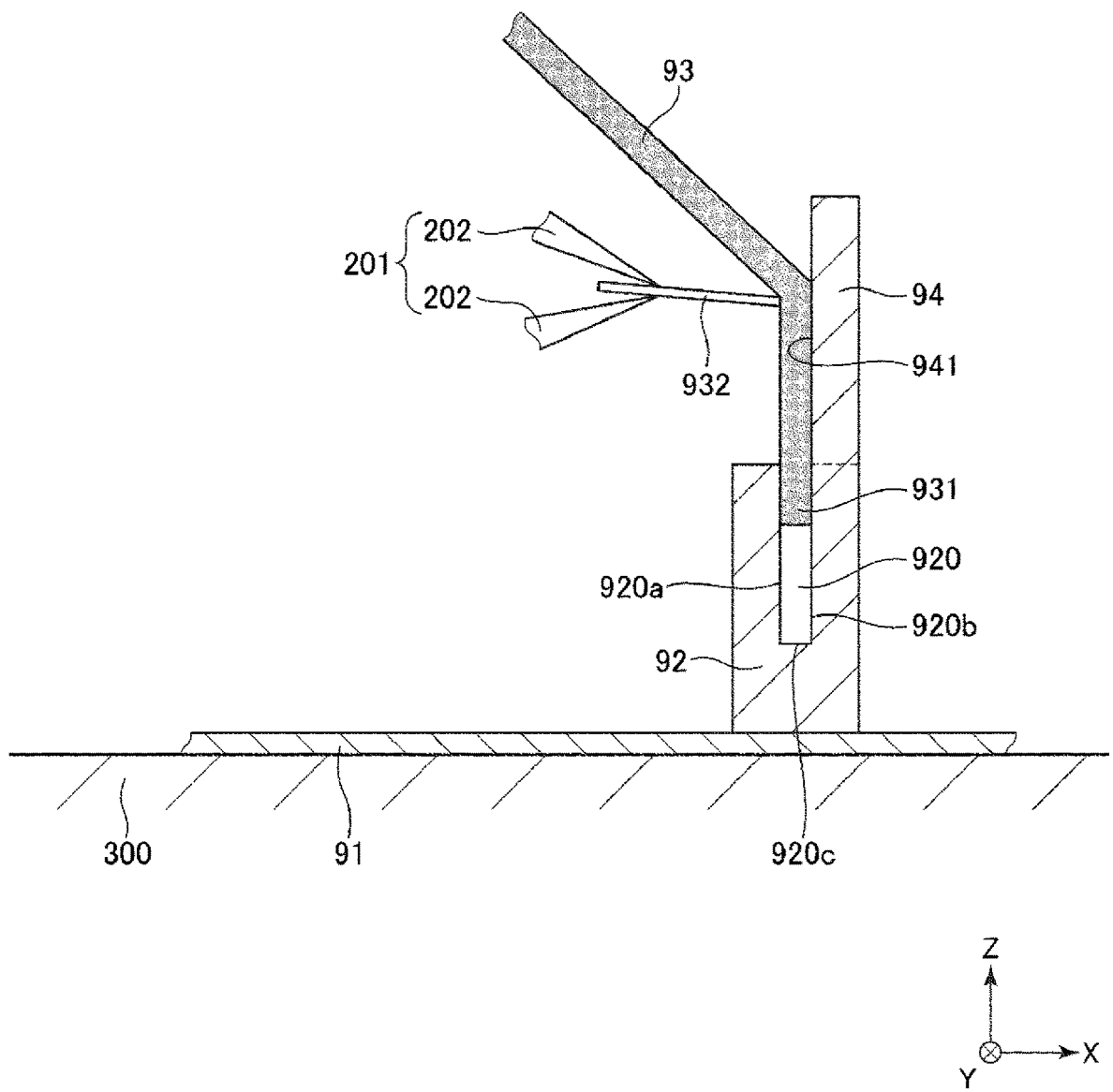
FIG. 20 is a sectional view showing the coupling method of coupling the flat cable to the connector.
Figure 21:
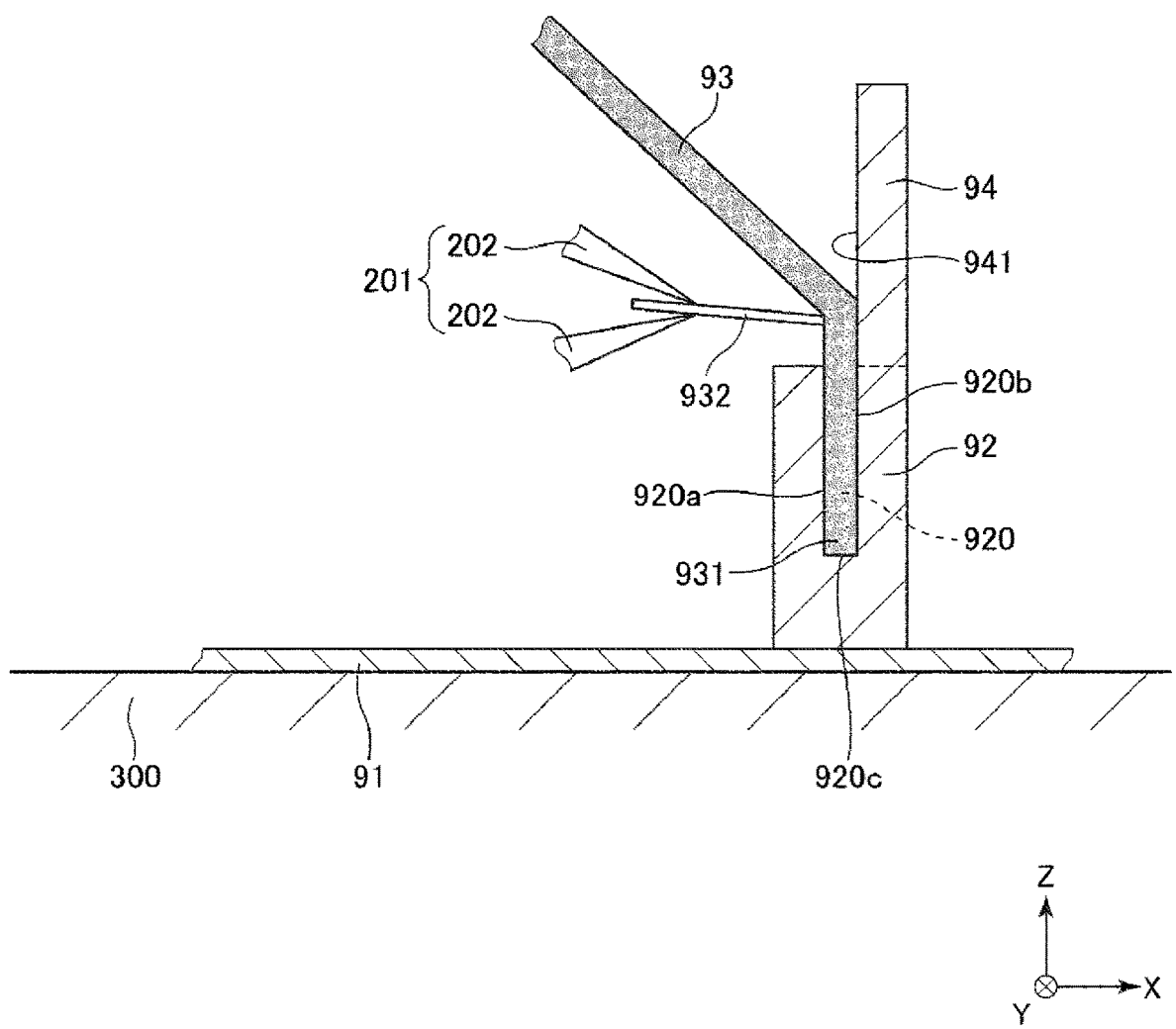
FIG. 21 is a sectional view showing the coupling method of coupling the flat cable to the connector.

FIG. 18 is a sectional view showing a substrate according to a sixth embodiment. FIGS. 19 to 21 are respectively sectional views showing a coupling method of coupling the flat cable to the connector.

The coupling method and the robot system 100 of the embodiment are the same as the coupling method and the robot system 100 of the above described first embodiment except that the insertion hole 920 of the connector 92 faces upward in the vertical direction, i.e., the plus side in the Z-axis direction. Note that, in the following description, the embodiment will be explained with a focus on the differences from the above described second embodiment and the explanation of the same items will be omitted. In FIGS. 18 to 21, the same configurations as those of the above described embodiments have the same signs.

As shown in FIG. 18, in the robot system 100 of the embodiment, the connector 92 is provided on the principal surface of the substrate 91 and stood relative to the substrate 91. When the substrate 91 is mounted on the workbench 300, the insertion hole 920 of the connector 92 faces upward in the vertical direction, i.e., the plus side in the Z-axis direction. That is, the insertion hole 920 opens in a normal direction of the upper surface as the principal surface of the substrate 91, i.e., upward in FIG. 18. Thereby, the coupling work is harder to be disturbed by various types of circuit elements located around the connector 92.

Next, the coupling method between the connector 92 and the flat cable 93 will be explained. The coupling method has the preparation step, the first moving step, the pressing step, and the second moving step like the above described second embodiment. The preparation step is the same as that of the above described second embodiment and the explanation thereof will be omitted as below.

[2] First Moving Step

At the step, first, the robot 1 is driven to grip the tab 932 of the flat cable 93 by the gripping unit 201. Then, the robot 1 is driven to move the flat cable 93 to a side of the seat 94, i.e., the minus side in the X-axis direction as shown in FIG. 19.

[3] Pressing Step

At the step, first, the robot 1 is driven to set the flat cable 93 in the width direction along the Y-axis and set the flat cable 93 in a posture inclined relative to the introduction surface 941 of the seat 94 with the coupling end portion 931 as the end thereof facing the seat 94 side, i.e., the plus side in the X-axis direction.

Then, the robot 1 is driven to move the flat cable 93 toward the plus side in the X-axis direction with the posture thereof maintained and, as shown in FIG. 20, press the coupling end portion 931 against the introduction surface 941. Thereby, the portion pressed against the introduction surface 941 bends along the introduction surface 941, and the coupling end portion 931 moves toward the connector 92 side, i.e., the minus side in the Z-axis direction along the introduction surface 941 by the bending.

[4] Second Moving Step

At the step, as shown in FIG. 21, the robot 1 is driven to move the flat cable 93 toward the connector 92 side, i.e., the minus side in the Z-axis direction and insert the coupling end portion 931 into the connector 92 to a sufficient insertion depth. Thereby, the flat cable 93 and the connector 92 may be coupled more reliably.

According to the sixth embodiment, the same effects as those of the above described first embodiment may be exerted.

As above, the coupling method and the robot system according to the present disclosure are explained based on the illustrated preferred embodiments, however, the present disclosure is not limited to those. The respective parts forming the robot system may be replaced by arbitrary configurations that may exert the same functions. Or, another arbitrary configuration may be added thereto. Or, the above described respective embodiments may be preferably combined.

Figure 22:
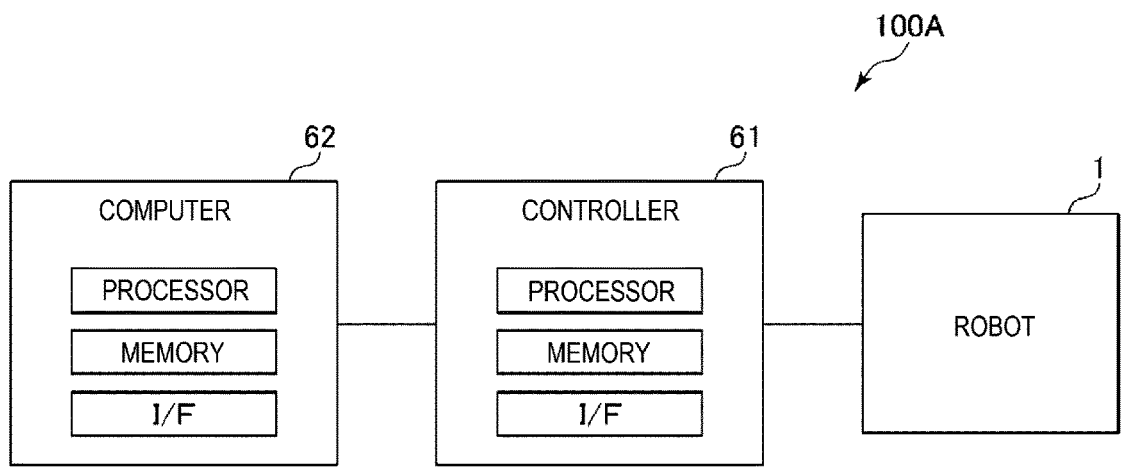
FIG. 22 is a block diagram showing a hardware configuration of a robot system.

As below, hardware configurations of robot systems will be explained. FIG. 22 shows an overall configuration of a robot system 100A in which the robot 1, a controller 61, and a computer 62 are coupled. The control of the robot 1 may be executed by reading a command in a memory by a processor in the controller 61 or reading a command in a memory by a processor in the computer 62 via the controller 61. Therefore, one or both of the controller 61 and the computer 62 may be regarded as "robot control apparatus 200".

Figure 23:
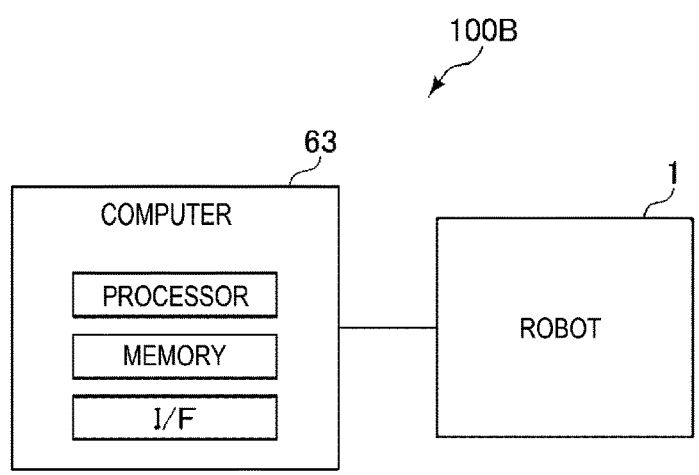
FIG. 23 is a block diagram showing a hardware configuration of a robot system.

Further, FIG. 23 shows an overall configuration of a robot system 1006 in which a computer 63 is directly coupled to the robot 1. The control of the robot 1 is directly executed by reading a command in a memory by a processor in the computer 63. Therefore, the computer 63 may be regarded as "robot control apparatus 200".

Figure 24:
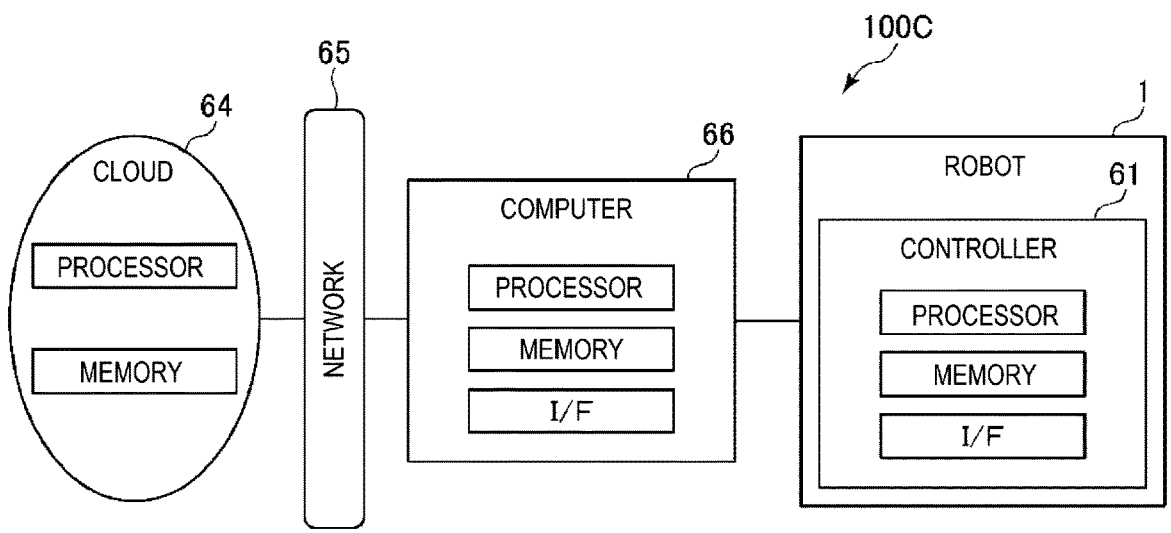
FIG. 24 is a block diagram showing a hardware configuration of a robot system.

Furthermore, FIG. 24 shows an overall configuration of a robot system 100C in which the robot 1 with the controller 61 provided inside and a computer 66 are coupled and the computer 66 is coupled to a cloud 64 via a network 65 such as a LAN. The control of the robot 1 may be executed by reading a command in a memory by a processor in the computer 66 or reading a command in a memory by a processor on the cloud 64 via the computer 66. Therefore, one, two, or three of the controller 61, the computer 66, and the cloud 64 may be regarded as "robot control apparatus 200".

What is claimed is:

1. A coupling method of coupling a flexible flat cable to a connector by a robot, comprising:
   a preparation step of preparing the connector having an insertion hole into which the flat cable is inserted and a seat having an introduction surface placed at a front side of the insertion hole and continuously coupled to the insertion hole;
   a first moving step of gripping the flat cable and moving the flat cable to a position facing the seat; and
   a pressing step of bringing the flat cable into contact with the introduction surface in a posture inclined relative to the seat with an end of the flat cable facing the insertion hole side and pressing the flat cable against the introduction surface, and moving the end of the flat cable toward the connector side,
   wherein in the pressing step, a coupling end portion (931) of the flat cable is inserted into the insertion hole (920) of the connector.

2. The coupling method according to claim 1, further comprising a second moving step of further moving the end toward the connector side after the pressing step.

3. The coupling method according to claim 1, further comprising:
   a force sensor that detects a contact between the flat cable and the introduction surface is placed, and
   wherein the contact between the flat cable and the introduction surface is detected based on output of the force sensor.

4. The coupling method according to claim 1, further comprising
   an imaging unit that images a region containing the connector and the seat, and
   a position of the flat cable relative to the base is detected based on an imaging result of the imaging unit.

5. The coupling method according to claim 1, wherein the connector is provided on a principal surface of a substrate, and the insertion hole opens in a normal direction of the principal surface.

6. The coupling method according to claim 1, wherein the seat is detachable from the connector,
   further comprising a seat detachment step of detaching the seat from the connector after coupling the flat cable to the connector.

7. A robot system that performs a work of coupling a flexible flat cable to a connector, comprising:
   a robot that grips the flat cable; and
   a robot control apparatus that controls the robot, wherein the connector has an insertion hole into which the flat cable is inserted,
   a seat having an introduction surface continuously coupled to the insertion hole is placed at a front side of the insertion hole, and
   the robot control apparatus controls the robot to perform a first moving operation of gripping the flat cable and moving the flat cable to a position facing the seat, and
   a pressing operation of bringing the flat cable into contact with the introduction surface in a posture inclined relative to the seat with an end of the flat cable facing the insertion hole side and further pressing the flat cable against the introduction surface, and moving the end toward the connector side, wherein in the pressing operation, a coupling end portion (931) of the flat cable is inserted into the insertion hole (920) of the connector.

\* \* \* \* \*